(12) United States Patent
Kitae et al.

(10) Patent No.: US 9,426,899 B2
(45) Date of Patent: Aug. 23, 2016

(54) ELECTRONIC COMPONENT ASSEMBLY

(75) Inventors: Takashi Kitae, Osaka (JP); Seiichi Nakatani, Osaka (JP); Seiji Karashima, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1253 days.

(21) Appl. No.: 12/439,602

(22) PCT Filed: Apr. 24, 2008

(86) PCT No.: PCT/JP2008/001076
§ 371 (c)(1),
(2), (4) Date: Mar. 2, 2009

(87) PCT Pub. No.: WO2008/139701
PCT Pub. Date: Nov. 20, 2008

(65) Prior Publication Data
US 2010/0011572 A1     Jan. 21, 2010

(30) Foreign Application Priority Data
Apr. 27, 2007  (JP) ............................... P2007-118235

(51) Int. Cl.
*B23P 19/00* (2006.01)
*H05K 13/04* (2006.01)
(Continued)

(52) U.S. Cl.
CPC ......... *H05K 3/3436* (2013.01); *H01L 21/6835* (2013.01); *H01L 24/11* (2013.01);
(Continued)

(58) Field of Classification Search
CPC ... H01L 21/6835; H01L 24/12; H01L 24/11; H01L 24/16; H05K 3/3436; H05K 3/3484; Y10T 29/49137; Y10T 29/49144

USPC .......... 174/250, 260; 29/836, 840; 438/106, 438/107, 109
See application file for complete search history.

(56) References Cited

U.S. PATENT DOCUMENTS 5,145,532 A    9/1992  Fukunaga et al.
5,241,134 A *  8/1993  Yoo ............................ 174/94 R
(Continued)

FOREIGN PATENT DOCUMENTS

JP    1-157796    6/1989
JP    9-199540    7/1997
(Continued)

OTHER PUBLICATIONS

Patent Cooperation Treaty (PCT) International Preliminary Report on Patentability issued Nov. 10, 2009 in corresponding International Application No. PCT/JP2008/001076.
(Continued)

*Primary Examiner* — Paul D Kim
(74) *Attorney, Agent, or Firm* — Wenderoth, Lind & Ponack, L.L.P.

(57) ABSTRACT

An electronic component assembly including a first electronic component including a plurality of first electrodes provided on a first major surface of the first electronic component; and a second electronic component including a plurality of second electrodes provided on a first major surface of the second electronic component. A resin including solder powder is provided between the first electronic component and the second electronic component. Also, solder connections are provided to electrically interconnect the first and second electrodes. Elongated grooves are provided in surfaces of the electronic components. The grooves are provided for generation of bubbles during the process for producing the electronic component assembly to promote movement of the solder powder.

7 Claims, 13 Drawing Sheets

(51) Int. Cl.
*H05K 3/34* (2006.01)
*H01L 21/683* (2006.01)
*H01L 23/00* (2006.01)
*H01L 29/06* (2006.01)
*H05K 3/32* (2006.01)

(52) U.S. Cl.
CPC .............. *H01L 24/12* (2013.01); *H01L 24/16* (2013.01); *H05K 3/3484* (2013.01); *H01L 24/81* (2013.01); *H01L 29/0657* (2013.01); *H01L 2224/13099* (2013.01); *H01L 2224/16* (2013.01); *H01L 2224/293* (2013.01); *H01L 2224/8101* (2013.01); *H01L 2224/81201* (2013.01); *H01L 2224/81801* (2013.01); *H01L 2924/0102* (2013.01); *H01L 2924/014* (2013.01); *H01L 2924/01004* (2013.01); *H01L 2924/01005* (2013.01); *H01L 2924/01006* (2013.01); *H01L 2924/01009* (2013.01); *H01L 2924/01011* (2013.01); *H01L 2924/01013* (2013.01); *H01L 2924/01023* (2013.01); *H01L 2924/01027* (2013.01); *H01L 2924/01033* (2013.01); *H01L 2924/01056* (2013.01); *H01L 2924/01074* (2013.01); *H01L 2924/01078* (2013.01); *H01L 2924/01082* (2013.01); *H01L 2924/09701* (2013.01); *H01L 2924/10157* (2013.01); *H01L 2924/14* (2013.01); *H01L 2924/15787* (2013.01); *H01L 2924/15788* (2013.01); *H05K 3/323* (2013.01); *H05K 2201/09036* (2013.01); *H05K 2201/10977* (2013.01); *H05K 2203/083* (2013.01); *H05K 2203/087* (2013.01); *Y02P 70/613* (2015.11); *Y10T 29/49137* (2015.01); *Y10T 29/49144* (2015.01)

(56) References Cited

U.S. PATENT DOCUMENTS

| | | | | |
|---|---|---|---|---|
| 5,592,737 A | * | 1/1997 | Middelman et al. | 29/848 |
| 5,668,033 A | * | 9/1997 | Ohara et al. | 438/113 |
| 6,011,693 A | * | 1/2000 | Gore | 361/760 |
| 6,479,321 B2 | * | 11/2002 | Wang et al. | 438/109 |
| 6,605,828 B1 | * | 8/2003 | Schwarzrock et al. | 257/81 |
| 6,767,757 B2 | * | 7/2004 | Kang et al. | 438/48 |
| 6,879,492 B2 | * | 4/2005 | Alcoe et al. | 361/748 |
| 6,884,655 B2 | * | 4/2005 | Iljima et al. | 438/107 |
| 7,042,056 B2 | * | 5/2006 | Koshido | 257/414 |
| 7,151,009 B2 | * | 12/2006 | Kim et al. | 438/106 |
| 7,151,010 B2 | * | 12/2006 | Nguyen et al. | 438/107 |
| 2004/0118594 A1 | * | 6/2004 | Dory et al. | 174/250 |
| 2005/0073032 A1 | * | 4/2005 | Tao | 257/676 |
| 2007/0001313 A1 | | 1/2007 | Fujimoto et al. | |
| 2007/0257362 A1 | | 11/2007 | Karashima et al. | |
| 2007/0273019 A1 | * | 11/2007 | Huang et al. | 257/690 |
| 2007/0295532 A1 | * | 12/2007 | Kariya et al. | 174/260 |
| 2008/0017995 A1 | | 1/2008 | Karashima et al. | |
| 2008/0284046 A1 | | 11/2008 | Karashima et al. | |
| 2010/0011572 A1 | * | 1/2010 | Kitae et al. | 29/836 |
| 2011/0215431 A1 | * | 9/2011 | Azoley et al. | 257/417 |

FOREIGN PATENT DOCUMENTS

| | | |
|---|---|---|
| JP | 2000-94179 | 4/2000 |
| JP | 2000-332055 | 11/2000 |
| JP | 2004-260131 | 9/2004 |
| JP | 2006-100775 | 4/2006 |
| JP | 2006-114865 | 4/2006 |
| WO | 2006/103948 | 10/2006 |
| WO | 2007/029452 | 3/2007 |

OTHER PUBLICATIONS

International Search Report issued Jun. 10, 2008 in the International (PCT) Application of which the present application is the U.S. National Stage.

Masahiro Yasusa et al., 10th Symposium on Microjoining and Assembly Technology in Electronics, "*Self-Organized Joining Assembly Process by Electrically Conductive Adhesive Using Low Melting Point Fillers*" Feb. 5-6, 2003, pp. 183-188.

Masahiro Rito et al., 9th Symposium on Microjoining and Assembly Technology in Electronics, "*Assembly Process by Electrically Conductive Adhesive Using Low Melting Point Fillers*", Feb. 6-7, 2003, pp. 115-120.

* cited by examiner

Fig. 6
(a)
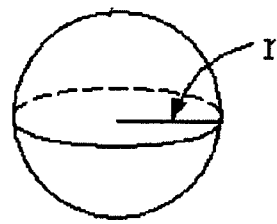
(b)
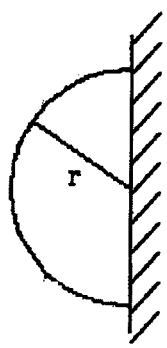
(c)
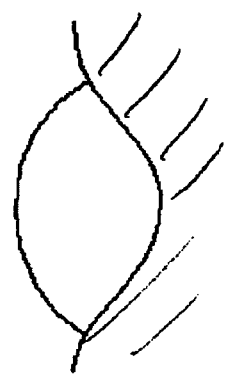

Points a and b: Opposed surface edge points of the concave portion

Point c: Center bottom point of the concave portion, located at an equal distance respectively from points a and b Fig. 15
(a)
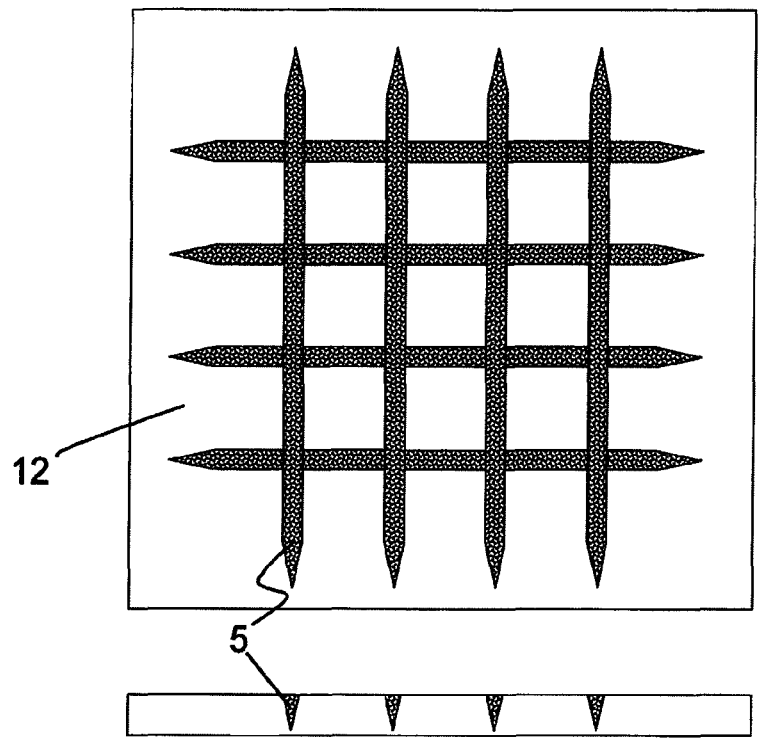
(b)
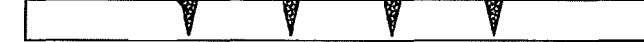
(c)
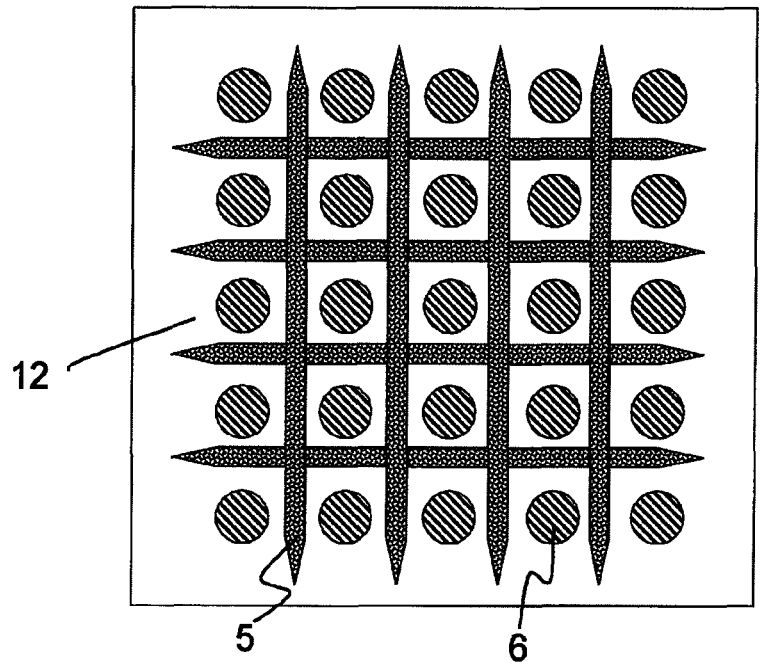

ELECTRONIC COMPONENT ASSEMBLY

BACKGROUND OF THE INVENTION

1. Technical Field

The present invention relates to an electronic component assembly, an electronic component having solder bumps, and processes for producing such assembly and component. More particularly, the present invention relates to the electronic component assembly and the electronic component having solder bumps, each of which is characterized by a concave portion being provided on a surface of the electronic component. And also, the present invention particularly relates to a process for producing the electronic component assembly and the electronic component having solder bumps, by the use of an electronic component whose surface is provided with a concave portion.

2. Description of the Related Art

With a development of high density and high integration of a semiconductor integrated circuit (LSI) used for electronics device, higher pin count and finer pitch of electrodes of LSI chip have been rapidly developed in recent years. The LSI chip is mounted over a circuit substrate by generally performing a flip-chip mounting process in order to decrease wiring delay. It is a common practice in this flip-chip mounting process to form solder bumps on the electrodes of the LSI chip, and then connect, through such solder bumps, all the electrodes of the LSI chip to all electrodes formed on the circuit substrate in a batch process.

For mounting a next-generation LSI having 5000 or more electrodes over the circuit substrate, it is required to form fine-pitch bumps with its pitch of 100 µm or less. It is, however, difficult for a conventional solder bump forming process to form such fine-pitch bumps. Moreover, from a viewpoint that a large number of bumps must be formed depending on the number of the electrodes, a reduction of the mounting tact time per chip is required for reducing a manufacturing cost.

Conventionally, there has been developed a plating process and a screen printing process as a bump forming process. The plating process is convenient for achieving the fine pitch, but it is complicated and has to compromise the productivity. The screen printing process, on the other hand, has a high productivity, but is not convenient for achieving the fine pitch since the use of a mask is required.

Recently, there has been developed several processes for selectively forming solder bumps on electrodes of the LSI chip or circuit substrate. These processes are not only convenient for forming fine bumps, but also convenient for achieving a high productivity since a plurality of the fine bumps can be formed in a batch process. Accordingly they are expected as promising processes that can be applicable to the mounting of the next-generation LSI over the circuit substrate.

According to one of these promising processes, there is a solder paste process (for example, see Japanese Patent Kokai Publication No. 2000-94179 which is referred to also as "Patent literature 1"). In this process, a solder paste comprising a mixture of metal particles and a flux is applied directly onto a substrate having electrodes thereon, and subsequently the substrate is heated so as to melt the metal particles. As a result, the solder bumps are formed selectively on the electrodes due to the wettability thereof.

There is also another process called as a super solder paste process wherein a paste composition ("deposition type solder using chemical reaction") mainly comprising organic acid lead salt and tin metal is applied directly onto a substrate having electrodes thereon, and subsequently the substrate is heated so as to induce a displacement reaction for Pb and Sn, and thereby Pb/Sn alloy is selectively deposited on electrodes of the substrate. For example, see Japanese Patent Kokai Publication No. H01-157796 (which is referred to also as "Patent literature 2").

In both of the solder paste process and the super solder paste processes, the paste composition is applied onto the substrate and thus a local variation in thickness and the solder concentration of the applied composition is occurred. This causes the deposition amount of the solder to differ from one electrode to another, and therefore their processes cannot form bumps which are all equal in height. As to such processes, the paste composition is applied onto the substrate of which surface is not smooth due to the electrodes formed thereon (namely, electrode-forming regions form convex portions whereas no electrode-forming regions form recess portions). As a result, an insufficient amount of the solder is supplied on the electrodes having a higher level than that of the substrate surface, and thus it is difficult to form the bumps with satisfactory heights required for the flip-chip mounting.

By the way, as for a flip-chip mounting process employing a conventional bump forming technique, subsequent to mounting a semiconductor chip over a circuit substrate having bumps formed thereon, it is required that a resin (which is called "underfill") is poured into a clearance gap formed between the circuit substrate and the semiconductor chip so as to secure the semiconductor chip to the circuit substrate.

There has been developed a process making it possible to perform not only an electrical connection between the electrodes of the semiconductor chip and the electrodes of the circuit board, but also a securing of the semiconductor chip to the circuit substrate. For example, according to a process disclosed in Japanese Patent Kokai Publication No. 2000-332055 (which is referred to also as "Patent literature 3"), a flip-chip mounting is performed with the use of an anisotropic electrically conductive material. In this process, a thermosetting resin comprising electrically conductive particles is supplied between the circuit substrate and the semiconductor chip, and subsequently the semiconductor chip is pressed and at the same time the thermosetting resin is heated. As a result, the electrical connection between the electrodes of the semiconductor chip and the circuit substrate, and the securing of the semiconductor chip to the circuit substrate are concurrently achieved. The anisotropic electrically conductive material is available for the connection between circuit boards as well as for the connection between the semiconductor chip and the circuit board.

However, in the case of the above flip-chip mounting process using the anisotropic conductive material, an electrical conduction between the opposing electrodes is achieved due to a mechanical contact through the electrically conductive particles, and thus a stability of the electrical conduction is hard to maintain.

That is to say, considering an applicability to the next-generation LSI chip having 5000 or more electrodes, the flip-chip mounting process using the anisotropic conductive material has lots of problems in terms of productivity and reliability. There are similar problems with the connection between circuit boards, which must meet the requirements for smaller pitch, larger number of pins and higher reliability.

Recently, novel processes of forming solder connections or solder bumps by making use of self-congregating solder technique have been proposed as the flip-chip mounting process and solder bump forming process that can be applied to the next-generation LSI. For example, see Japanese Patent Kokai Publication No. 2006-100775 (which is referred to also as "Patent literature 4") and Japanese Patent Kokai Publication No. 2006-114865 (which is referred to also as "Patent literature 5"). With this technique, solder connections or solder bumps are formed on electrodes through self-congregation or aggregation of solder powder thereonto.

Patent literature 1: Japanese Patent Kokai Publication No. 2000-94179
Patent literature 2: Japanese Patent Kokai Publication No. H01-157796
Patent literature 3: Japanese Patent Kokai Publication No. 2000-332055
Patent literature 4: Japanese Patent Kokai Publication No. 2006-100775
Patent literature 5: Japanese Patent Kokai Publication No. 2006-114865
Patent literature 6: Japanese Patent Kokai Publication No. 2004-260131
Non-patent literature 1: 10th Symposium on "Microjoining and Assembly Technology in Electronics" Feb. 5-6, 2004, pp. 183-188
Non-patent literature 2: 9th Symposium on "Microjoining and Assembly Technology in Electronics" Feb. 6-7, 2003, pp. 115-120

SUMMARY OF THE INVENTION

1. Problems to be Solved

With reference to FIGS. 1 and 2, a mechanism of self-congregating solder technique wherein gas bubbles are utilized will be described. FIG. 1 schematically illustrates a mechanism of self-congregating in a case of forming solder connections 8 between electrodes of an electronic component 1 and an electronic component 2. FIG. 2 schematically illustrates a mechanism of self-congregating in a case of forming solder bumps 9 on electrodes 6 of the electronic component 1. As shown on the left side of FIGS. 1 and 2, a resin 7 is forced to move into a space between the electrodes 6 of the electronic components 1 and 2 (see FIG. 1) or above the electrodes 6 of the electronic component 1 (see FIG. 2) due to a stress caused by bubbles 10 which has been generated by heating. This is because the resin becomes more stable when it is situated in a small space between the electrodes or above the electrodes, due to a surface tension of the resin. As the resin 7 moves, solder powder 4 contained in the resin 7 also moves into a space between the electrodes 6 (see FIG. 1) or above the electrodes 6 (see FIG. 2), so that the solder powder 4 self-congregates. Eventually the solder powder 4 spreads onto the electrodes 6, resulting in a formation of the solder connections 8 (see the right side of FIG. 1) or the solder bumps 9 (see the right side of FIG. 2).

In the self-congregating solder technique, the form of bubble generation has a great influence on the quality of the solder connections or the solder bumps. It is important for the bubbles to generate uniformly in a desired region, in which case it is more desirable that a residence time of the bubbles above the electrodes is shorter in the light of the mechanism described above. In a case where a solder resin mixture has a source of gas, the gas bubbles tend to be generated on and above the electrodes of the electronic component. It is important to control these bubbles so as to allow the solder powder to efficiently self-congregate. In this regard, a new twist to the control of the bubbles is required to achieve a more uniform formation of the solder connections or solder bumps. The same is true for the case where the electronic component has a source of gas, in which case the bubbles tend to be generated in the vicinity of the electrodes.

2. Means for Solving the Problems

In the light of the above, the inventors of the applicant have deliberated to provide creative inventions. One of these inventions is a process for producing an electronic component assembly wherein a plurality of electrodes (a) provided on a surface (A) of a first electronic component and a plurality of electrodes (b) provided on a surface (B) of a second electronic component are electrically interconnected by means of a solder, the process comprising the steps of:

(1) preparing a first electronic component whose surface (A) is provided with a plurality of electrodes (a) and a second electronic component whose surface (B) is provided with a plurality of electrodes (b) wherein at least one concave portion (or "recess" or "notched portion" or "through-hole") is formed in the surface (A) (except for a surface region on which the electrodes (a) are provided) and/or the surface (B) (except for a surface region on which the electrodes (b) are provided);

(2) supplying a resin that comprises a solder powder onto the surface (A) of the first electronic component;

(3) bringing the second electronic component into contact with a surface of the resin supplied in the step (2) such that the plurality of electrodes (a) of the first electronic component are respectively opposed to the plurality of electrodes (b) of the second electronic component; and (4) heating the first electronic component and/or the second electronic component while keeping the second electronic component in contact with the surface of the supplied resin, and thereby forming solder connections from the solder powder, the solder connections serving to electrically interconnect the electrodes (a) and (b), wherein, upon the heating of the step (4), gas bubbles are generated within the resin such that the bubble generation originates at least from the concave portion, and the generated bubbles cause the solder powder to move and congregate onto the electrodes (a) and (b). In accordance of this process of the present invention, a point of bubble generation is controlled so that the solder powder (or molten solder) efficiently self-congregates into a space between the electrodes, thereby making it possible to form more uniform solder connections.

Another invention is a process for producing an electronic component having solder bumps, comprising the steps of:

(1) preparing an electronic component wherein a plurality of electrodes are provided on a surface thereof, and at least one concave portion (or "recess" or "notched portion" or "through-hole") is formed in the surface (except for a surface region on which the electrodes are provided);

(2) supplying a resin that comprises a solder powder onto the surface of the electronic component;

(3) bringing a flat plate into contact with a surface of the resin supplied in the step (2); and (4) heating the electronic component and/or the flat plate while keeping the flat plate in contact with the surface of the supplied resin, and thereby forming solder bumps on the electrodes, wherein, upon the heating of the step (4), gas bubbles are generated within the resin such that the bubble generation originates at least from the concave portion, and the generated bubbles cause the solder powder to move and congregate onto the electrodes. In accordance of this process of the present invention, a point of bubble generation is controlled so that the solder powder (or molten solder) efficiently self-congregates onto the electrodes, thereby making it possible to form more uniform solder bumps.

The term "self-congregation" as used herein in relation to the solder powder means such an embodiment that the solder connections or the solder bumps are formed on the intended electrodes by applying a solder resin mixture (i.e. mixture of a resin and a solder powder dispersed uniformly therein) evenly onto suitable region (i.e. region where solder connections or solder bumps are to be formed), followed by a predetermined process such as a heating thereof. It should be noted that the congregation of the solder powder may occur in any suitable form so that the solder powder is allowed to move into a space between the electrodes or above the electrodes.

The sentence "bubbles are generated from the concave portion" or "bubble generation originates from the concave portion" as used herein substantially means that the bubble generation occurs preferentially or predominantly at the concave portion(s). Accordingly, such sentence is not necessarily interpreted as a limited embodiment wherein all bubbles are generated from the concave portion(s). In this regard, however, it is preferred that all the bubbles are generated from the concave portion(s).

As used in this description and claims, "concave portion(s)" is interpreted as portion(s) or region(s) formed intentionally in the electronic component or flat plate, and thus the concave portion is not a flaw, scratch or the like formed inevitably or accidentally upon producing the electronic component or flat plate.

Both of "process for producing an electronic component assembly" and "process for producing an electronic component having solder bumps" are characterized by the use of the electronic component having the concave portion(s) in the surface thereof (except for a surface region on which the electrodes are formed). Due to this characteristic, the bubble generation occurs at least from the concave portion(s) upon the heating. This means that the bubble generation can be controlled intentionally. It is preferable that the concave portion has a tapered shape with a taper angle of less than 90 degrees.

In one preferred embodiment, the concave portion is constructed continuously in the form of an elongated groove. In other words, a continuous recess is formed in the surface. For example, the concave portion having the form of a groove is configured to be parallel to an edge of the electronic component. In another preferred embodiment, the concave portion is configured to extend through the electronic component in the direction of thickness thereof. As for the process for producing an electronic component assembly as described above, the concave portion is configured to extend through the first electronic component and/or second electronic component. In further another preferred embodiment, the concave portion is formed in a central region between adjacent electrodes (namely, the concave portion is formed in a region located at equal distance from the two neighboring electrodes). As for the process for producing an electronic component assembly as described above, the concave portion is formed in the central region between the adjacent electrodes (a) and/or central region between the adjacent electrodes (b).

In one preferred embodiment, the concave portion is formed in the surface of the electronic component by means of laser machining and the like. As for the process for producing the electronic component assembly as described above, by means of laser machining and the like, the concave portions are formed in the surface (A) of the first electronic component and/or the surface (B) of the second electronic component.

In one preferred embodiment, the electronic component contains a substance capable of generating gas, and thus the bubbles are produced therefrom. As for the process for producing the electronic component assembly as described above, the bubbles are produced from "substance capable of generating gas" contained in the first electronic component and/or the second electronic component. In another preferred embodiment, the resin used in the step (2) contains the substance capable of generating gas, and thus the bubbles are produced therefrom. The substance capable of generating gas is preferably at least one kind of "boiling-type of substance" selected from the group consisting of water, hexane, vinyl acetate, isopropyl alcohol, butyl acetate, propionic acid, ethylene glycol, N-methyl-2-pyrrolidone, α-terpineol, butyl carbitol, butyl carbitol acetate and diethylene glycol dimethyl ether. Alternatively, the substance capable of generating gas is preferably at least one kind of "decomposing-type of substance" selected from the group consisting of aluminum hydroxide, dawsonite, ammonium metaborate, barium metaborate, azodicarbonamide (ADCA), sodium hydrocarbonate, aluminum hydroxide, calcium aluminate, boric acid, N,N'-dinitrosopentamethylenetetramine (DPT) and 4,4'-oxybis(benzene sulfonyl hydrazide) (OBSH). Both of "boiling-type of substance" and "decomposing-type of substance" may be contained in the electronic component or resin. Of course, "boiling-type of substance" and/or "decomposing-type of substance" may be contained in the both of the electronic component and the resin.

In accordance with the process for producing the electronic component having solder bumps, even in a case where the concave portion is formed only in the surface of the flat plate, not the electronic component, it is possible to form the more uniform solder bumps by allowing the solder powder to efficiently self-congregate onto the electrodes with the bubbles that have been generated from the concave portion of the flat plate. In this case, the process for producing the electronic component having solder bumps comprises the steps of:

(1) preparing an electronic component wherein a plurality of electrodes are provided on a surface thereof;

(2) supplying a resin that comprises a solder powder onto the surface of the electronic component;

(3) bringing a flat plate into contact with a surface of the resin supplied in the step (2); and (4) heating the electronic component and/or the flat plate while keeping the flat plate in contact with the surface of the supplied resin, and thereby forming solder bumps on the electrodes, wherein at least one concave portion is formed in a surface of the flat plate;

in the step (3), the flat plate is brought into contact with the surface of the supplied resin such that the concave portion of the flat plate is opposed to a surface region of the electronic component where there is no electrode; and upon the heating of the step (4), gas bubbles are generated within the resin such that the bubble generation originates at least from the concave portion, and the generated bubbles cause the solder powder to move and congregate onto the electrodes.

The present invention also provides an electronic component assembly having at least one concave portion formed in the surface of an electronic component. Such electronic component assembly comprises:

a first electronic component comprising a plurality of electrodes (a) on a surface (A) thereof;

a second electronic component comprising a plurality of electrodes (b) on a surface (B) thereof; and solder connections disposed between the plurality of electrodes (a) and the plurality of electrodes (b) to electrically interconnect the electrodes (a) and (b), wherein at least one concave portion (or "recess" or "notched portion" or "through-hole") is formed in the surface (A) (except for a surface region on which the electrodes (a) are provided) and/or the surface (B) (except for a surface region on which the electrodes (b) are provided).

The present invention also provides an electronic component having solder bumps wherein at least one concave portion is formed in the surface of the electronic component. Such electronic component comprises:

an electronic component comprising a plurality of electrodes on a surface thereof; and a plurality of solder bumps formed on the electrodes, wherein at least one concave portion (or "recess" or "notched portion" or "through-hole") is formed in the surface of the electronic component (except for a surface region on which the electrodes are provided).

In one preferred embodiment regarding "electronic component assembly" and "electronic component having solder bumps", the concave portion is tapered with a taper angle of less than 90 degrees. In another embodiment, the concave portion is constructed continuously in the form of an elongated groove. For example, the concave portion having the form of a groove is configured to be parallel to an edge of the electronic component. In another preferred embodiment, the concave portion is configured to extend through the electronic component in the direction of thickness thereof. As for the electronic component assembly as described above, the concave portion is configured to extend through the first electronic component and/or second electronic component. In further another preferred embodiment, the concave portion is formed in a central region between adjacent electrodes (namely, the concave portion is formed in a region located at equal distance from the two neighboring electrodes). As for the electronic component assembly as described above, the concave portion is formed in the central region between the adjacent electrodes (a) and/or the central region between the adjacent electrodes (b).

3. Effect of the Invention

In accordance with the processes for producing the electronic component assembly and for producing the electronic component having solder bumps, at least part of the bubbles to be generated originate from the concave portions. Accordingly, the generated bubbles can promote the movement of the solder powder within the resin. Moreover, the bubbles are generated away from the electrodes, and thereby the bubbles are not likely to reside at a space between the electrodes or above the electrodes. As a result, the solder powder is forced to move and congregate (aggregate) more efficiently into a region between electrodes or above the electrodes. In other words, compared to the case of the congregation of the solder powder only due to the wettability, the solder powder is allowed to congregate more efficiently into a region between electrodes or above the electrodes. The efficient movement and congregation of the solder powder can not only achieve a reduced heating time and/or a lower heating temperature, but also achieve a satisfactory formation of the solder connections or solder bumps with the use of a proper amount of solder powder.

Furthermore, the above movement and congregation of the solder powder is performed uniformly because the originating point of the bubbles has been controlled. As a result, the solder connections of the electronic component assembly and the solder bumps of the electronic component satisfactorily become more uniform.

BRIEF DESCRIPTION OF THE DRAWINGS

FIGS. 6(a) to 6(c) are diagrams schematically illustrating various forms of the generated bubbles.

FIGS. 15(a) and 15(b) are top view and side view, respectively schematically illustrating a flat plate having concave portions, which was used in Example 3. FIG. 15(c) is a top transparent view of the flat plate which was used in Example 3 wherein the flat plate had been mounted on the circuit substrate.

Figure 1:
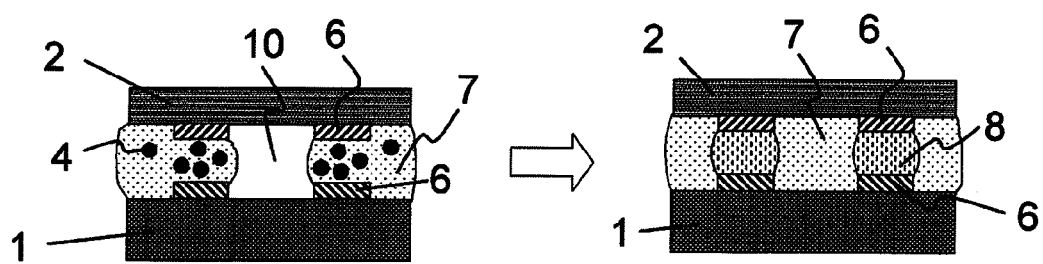
FIG. 1 is a schematic sectional view illustrating a mechanism of self-congregating phenomenon of solder, occurred upon a formation of solder connections.
Figure 2:
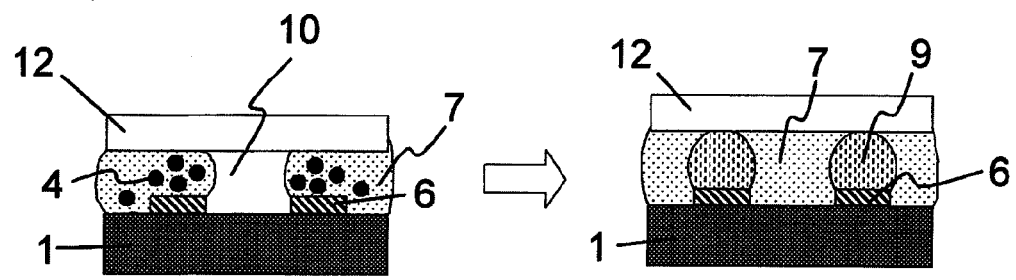
FIG. 2 is a schematic sectional view illustrating a mechanism of self-congregating phenomenon of solder, occurred upon a formation of solder bumps.

In the drawings, reference numerals correspond to the following elements:

1: First electronic component
2: Second electronic component
3: Resin composition (mixture of resin and solder)
4: Solder powder
5: Concave portion/Recess
6: Electrode
7: Resin (Resin component)
8: Solder connection
9: Solder bump
10: Bubble/Gas bubble
12: Flat plate (lid)

DETAILED DESCRIPTION OF THE INVENTION

With reference to the accompanying drawings, embodiments of the present invention will be hereinafter described in more detail. As to the drawings, the constituent elements having a substantially similar function carry the same reference numeral for ease of the explanation.

First Embodiment

Referring to FIGS. 3(a) to 3(e), a process for producing an electronic component assembly will be described in accordance with the first embodiment of the present invention. First, as shown in FIG. 3(a), a first electronic component 1 having a plurality of electrodes (a) 6 provided in a surface (A) thereof and a second electronic component 2 having a plurality of electrodes (b) 6 provided on a surface (B) thereof are prepared. At least one concave portion 5 is provided on the surface (A) of the first electronic component 1 (except for a surface region on which the electrodes (a) 6 are provided) Similarly, at least one concave portion 5 is provided on a surface (B) of the second electronic component 2 (except for a surface region on which electrodes (b) 6 are provided).

Then, as shown in FIG. 3(b), a resin composition 3 comprising a resin 7 and a solder powder 4 is supplied (e.g. applied) onto the surface (A) of the first electronic component 1 where the plurality of electrodes (a) 6 are formed.

Subsequently, as shown in FIG. 3(c), the second electronic component 2 is put into contact with a surface of the resin composition 3 that has been supplied onto the first electronic component 1. In so doing, the plurality of electrodes (a) 6 of the first electronic component 1 and the plurality of electrodes (b) 6 of the second electronic component 2 are opposed to each other.

Figure 3:
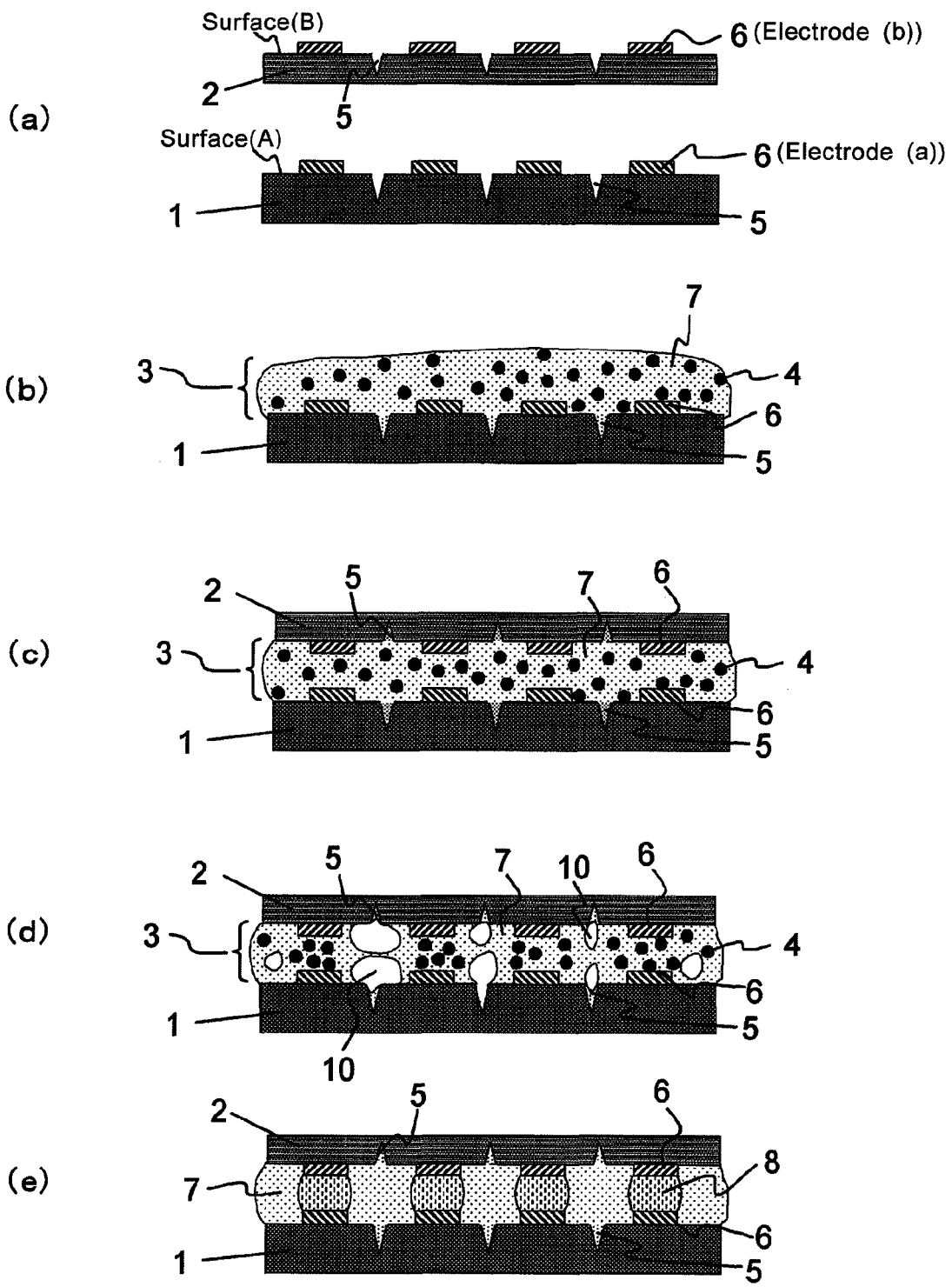
FIGS. 3(a) to 3(e) are sectional views illustrating a process for producing an electronic component assembly wherein an electronic component having concave portions formed therein is used.

Thereafter, the first electronic component 1 and/or the second electronic component 2 is heated while keeping the second electronic component 2 in contact with the surface of the resin composition 3. As will be described in detail later, it is possible for the first electronic component 1 and/or the second electronic component 2 to contain a substance capable of generating gas, and alternatively the resin composition 3 has been preliminarily prepared by adding the substance capable of generating gas thereto. As a result, such substance produces gas bubbles when heated. Since the concave portions are formed in the surface (A) of the first electronic component 1 and the surface (B) of the second electronic component 2, a generation of the bubbles originates at the concave portions as shown in FIG. 3(d) (physical phenomenon thereof will be described later). The generated bubbles from the concave portions can promote the movement of the resin 7 and the solder powder 4 contained therein. As shown in FIG. 3, each of the concave portions is formed between the neighboring electrodes, and thus it is located at a surface region away from the electrodes (a) and (b). Due to this arrangement of the concave portions, the generated bubbles are not likely to reside between the electrodes (a) and (b), and thereby the solder powder 4 is forced to congregate into a region between each electrode (a) and each electrode (b). After having moved into the region between the electrodes (a) and (b), the solder powder 4 is allowed to spread uniformly over each of electrodes (a) and (b) due to the wettability thereof. In other words, the generated bubbles from the concave portions are able to move effectively within the resin so that the movement of the solder powder is effectively promoted, and thereby a uniform bonding of the solder powder to each other is achieved. Eventually, the grown solder is cooled down to form a solder connection 8 between the electrodes (a) and (b). In this way, an electronic component assembly is obtained, wherein each electrode (a) of the first electronic component 1 is electrically interconnected with each electrode (b) of the second electronic component 2 (see FIG. 3(e)).

Second Embodiment

Referring to FIGS. 4(a) to 4(f), a process for producing an electronic component having solder bumps will now be described in accordance with the second embodiment of the present invention. First, as shown in FIG. 4(a), an electronic component 1 having a plurality of electrodes 6 provided on a surface thereof is prepared. At least one concave portion 5 is provided on the surface of the electronic component 1 (except for a surface region on which the electrodes 6 are provided).

Then, as shown in FIG. 4(b), a resin composition 3 comprising a resin 7 and a solder powder 4 is supplied (e.g. applied) onto the surface of the electronic component 1 where the plurality of electrodes 6 are formed.

Figure 4:
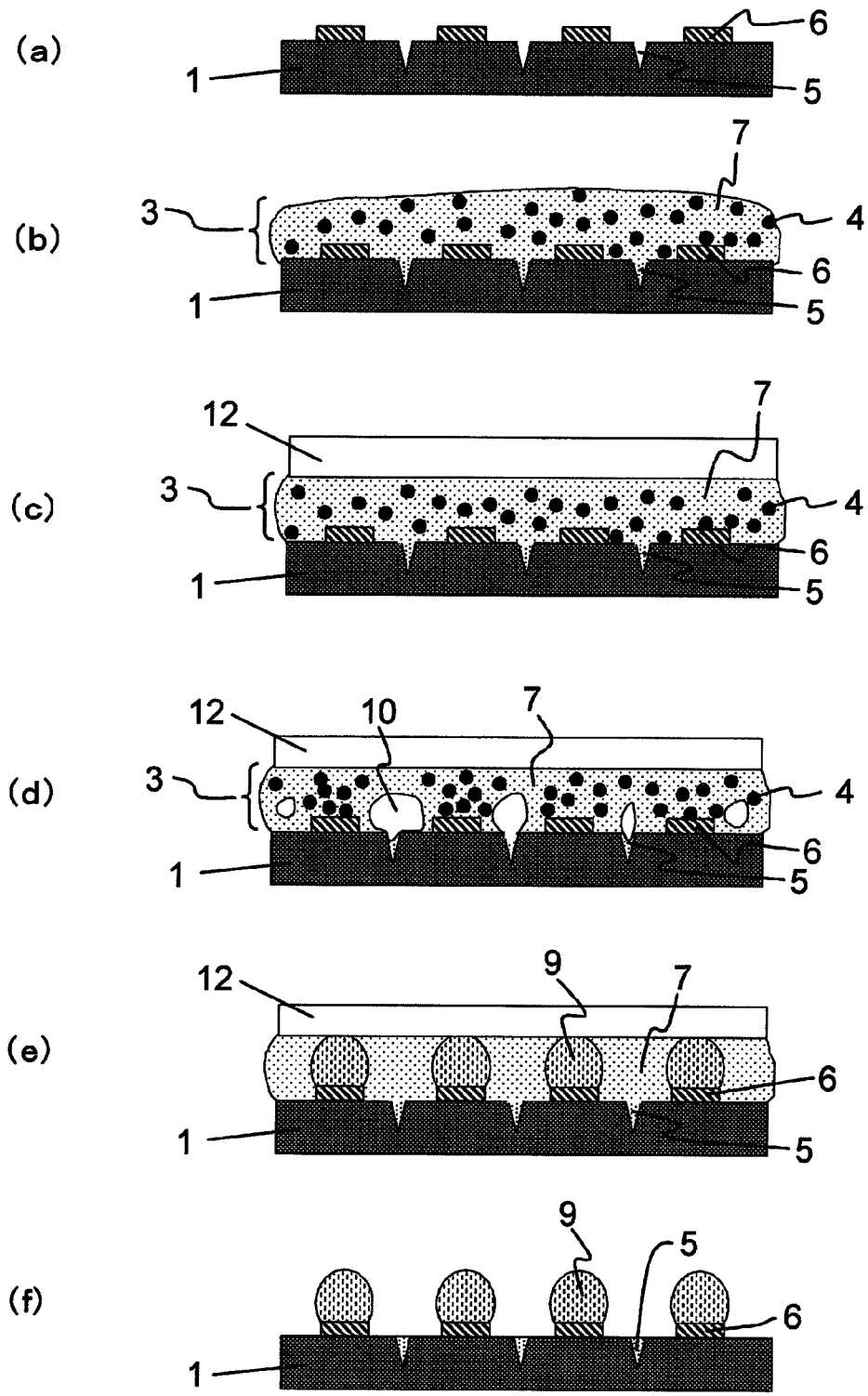
FIGS. 4(a) to 4(f) are sectional views illustrating a process for producing an electronic component with solder bumps wherein an electronic component having concave portions formed therein is used.

Subsequently, as shown in FIG. 4(c), a flat plate 12 is put into contact with a surface of the resin composition 3 that has been supplied onto the electronic component 1. This forms a substantially closed space between the flat plate and the electronic component (for the reason, the flat plate can be also referred to as "lid"). Thereafter, at least one of the flat plate 12 and the electronic component 1 is heated while keeping the flat plate 12 in contact with the surface of the resin composition 3. As will be described in detail later, it is possible for the electronic component 1 to contain a substance capable of generating gas, and alternatively the resin composition has been preliminarily prepared by adding the substance capable of generating gas thereto. As a result, such substance produces gas bubbles when heated. Since the concave portions are formed in the surface of the electronic component 1, the bubble generation originates at the concave portions as shown in FIG. 4(d) (physical phenomenon thereof will be described later). The generated bubbles from the concave portions can promote the movement of the resin 7 and the solder powder 4 contained therein. As shown in FIG. 4, each of the concave portions is formed between the neighboring electrodes, and thus it is located at a surface region away from the electrodes. Due to this arrangement of the concave portions, the generated bubbles are not likely to reside above the electrodes, and thereby the solder powder 4 is forced to congregate into the space above the electrodes. After having moved onto the electrodes, the solder powder 4 is allowed to spread uniformly over each of the electrodes due to the wettability thereof. In other words, the generated bubbles from the concave portions are able to move effectively within the resin so that the movement of the solder powder is effectively promoted, and thereby a uniform bonding of the solder powder to each other is achieved. Eventually, the grown solder is cooled down to form a solder bump 9 on each of the electrodes (see FIG. 4(*e*)). After that, the flat plate 12 is moved away from the surface of the resin (namely, the flat plate 12 is separated from the surface of the resin), followed by the removing of the resin 13. As a result, the electronic component equipped with the solder bumps is obtained as shown in FIG. 4(*f*). In order to remove the resin 13 from the solder bumps 9, a washing treatment with a solvent (e.g. isopropyl alcohol) may be performed.

Third Embodiment

Figure 5:
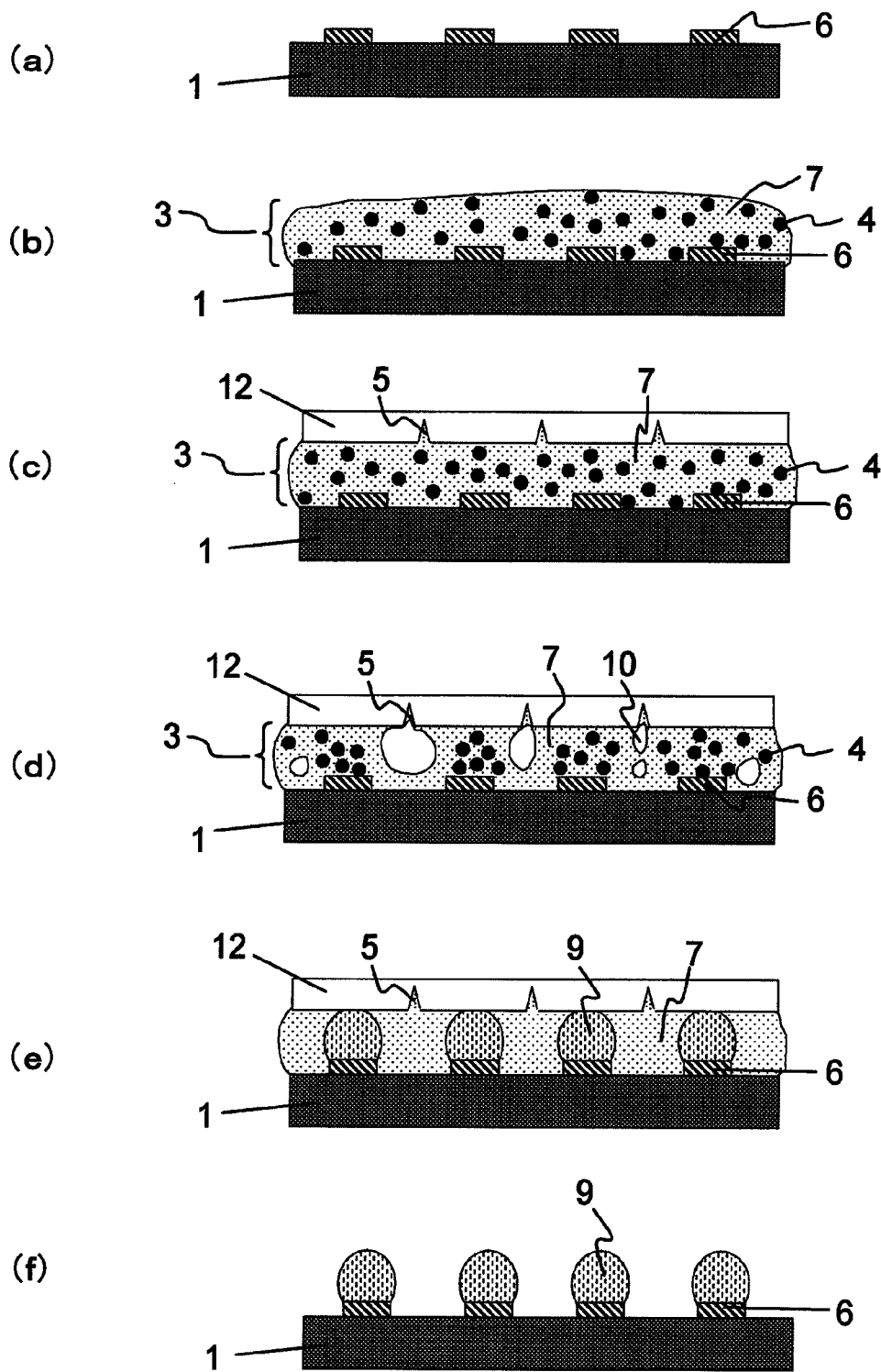
FIGS. 5(a) to 5(f) are sectional views illustrating a process for producing an electronic component with solder bumps wherein a flat plate having concave portions formed therein is used.

Referring to FIGS. 5(*a*) to 5(*f*), a process for producing an electronic component having solder bumps by the use of a flat plate having a concave portion formed therein will be described in accordance with the third embodiment of the present invention. This embodiment is similar to the second embodiment unless otherwise described, and so duplicate description will be avoided.

In the third embodiment, there are provided the concave portions 5 in the surface of the flat plate 12, not the surface of the electronic component 1. Accordingly, the generation of the bubbles originates at the concave portions 5 of the flat plate 12 (see FIG. 5(*d*)). The generated bubbles from the concave portions can promote the movement of the resin 7 and the solder powder 4 contained therein. As for this embodiment, it is preferable that the flat plate 12 is brought into contact with the surface of the supplied resin such that each concave portion 5 of the flat plate is opposed to a no-electrode surface region of the electronic component 1 where there is no electrode 6 provided, as shown in FIGS. 5(*c*) to 5(*e*). In this case, the generated bubbles are forced to reside away from the electrodes. This means that the bubbles tend not to reside above the electrodes. As a result, it becomes easier for the solder powder 4 to congregate onto the electrodes, and thereby a more uniform formation of the solder bumps 9 can be achieved, which is similar to the case of the second embodiment.

Now, the physical phenomenon on the bubble generation in which the bubble originates from the concave portion will be described. The generation of spherical bubble from the interior of the liquid as shown in FIG. 6(*a*) can be expressed by the following equation (1) in terms of energy:

(Equation 1)

$$U(r) = U_1(r) + U_2(r) = -\frac{4}{3}\pi a r^3 + 4\pi b r^2 \quad \text{(Equation 1)}$$

$$\left(\begin{array}{l} U(r)\text{: Energy for generating bubble} \\ U_1(r)\text{: Volume energy of bubble} \\ U_2(r)\text{: Surface area energy of bubble} \\ r\text{: Radius of bubble} \\ a, b\text{: Positive constants} \end{array}\right)$$

U(r) on the left side of the equation is an energy required to generate a bubble. The first term $U_1(r)$ on the right side is "volume energy of the bubble", and the second term $U_2(r)$ on the right side is "surface area energy (i.e. interfacial energy) of the bubble".

Since "volume energy of the bubble" is a negative term, the volume energy $U_1(r)$ of the bubble having radius r can decrease in proportion to the volume ($V=4\pi r^3/3$), which leads to a more stability of the bubble. In other words, the larger the bubble becomes, the smaller the energy required to generate the bubble becomes, and thereby the bubble can be present in a more stable state.

While on the other hand, since the surface area energy of the bubble is a positive term, the surface area energy $U_2(r)$ of the bubble having radius r can increase in proportion to the surface area $S=4\pi r^2$, which leads to a more instability of the bubble. This means that the smaller the interfacial area between the bubble and the liquid becomes, the smaller the energy required to generate the bubble becomes, and thereby the bubble can be present in a more stable state. This also means that the larger the interfacial area between the bubble and the liquid becomes, the larger the energy required to generate the bubble becomes, and thereby the bubble becomes unstable.

Figure 7:
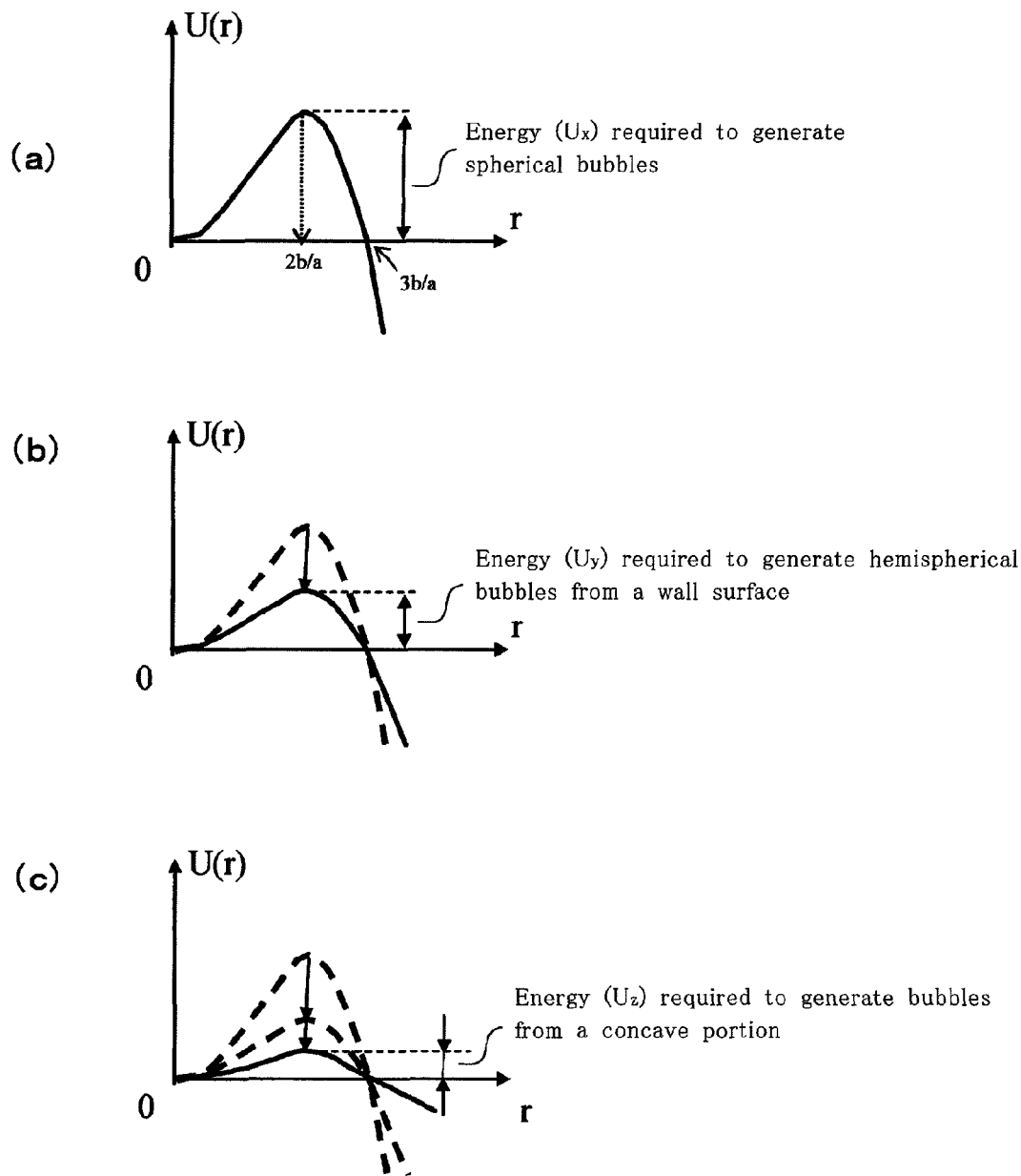
FIGS. 7(a) to 7(c) are graphs showing energies U(r) required to generate the bubbles shown in FIGS. 6(a) to 6(c) (namely, each of graphs shows a correlation between energy U(r) and bubble radius (r)).

The graphic representation of the energy U(r) for generating the spherical bubble is shown in FIG. 7(*a*). This graph shows that the energy for generating bubble increases so that the generated bubble becomes unstable with increasing radius of the bubble in a bubble radius range of from 0 to 2b/a. This means that the generated bubble with the radius of from 0 to 2b/a tends to shrink and disappear soon. While on the other hand, in the bubble radius range of 2b/a and over, the energy for generating bubble decreases so that the generated bubble becomes stable with increasing radius of the bubble. This means that the generated bubble with the radius of 2b/a and over tends to enlarge steadily.

Thus, it is required to form bubble with not less than some radius (i.e. not less than critical radius) in the liquid. In this case, the bubble can generate when it gains a necessary energy (e.g. thermal energy) from the outside environment.

Next, a generation of hemispherical bubble from a wall surface will be now described. The generation of hemispherical bubble as shown in FIG. 6(*b*) can be expressed by the following equation (2) in terms of energy:

(Equation 2)

$$U(r) = U_1(r) + U_2(r) = -\frac{2}{3}\pi a r^3 + 2\pi b r^2 \quad \text{(Equation 2)}$$

$$\left(\begin{array}{l} U(r)\text{: Energy for generating bubble} \\ U_1(r)\text{: Volume energy of bubble} \\ U_2(r)\text{: Surface area energy of bubble} \\ r\text{: Radius of bubble} \\ a, b\text{: Positive constants} \end{array}\right)$$

With respect to the equation (2), the graphic representation of the energy U(r) for generating the hemispherical bubble is shown in FIG. 7(*b*). As can be seen from the above equation (2) and FIG. 7(*b*), the energy required to generate the hemispherical bubble is one-half of that of the spherical bubble. This means that the hemispherical bubble can be generated more easily from the wall surface.

The present invention makes use of the principle as described above so that the bubble generation is performed at desired positions with less energy. Specifically, according to the present invention, there is provided concave portions at the desired positions of the wall surface. It is in this case expected that the gas bubble as shown in FIG. 6(*c*) is generated at each of the concave portions. It should be noted that, at this concave portion, the gas-liquid interfacial area is smaller so that "surface area energy $U_2$ (r) of the bubble" is smaller than that of another bubble having the same volume as the bubble generated from the concave portion. In other words, the bubble generated from the concave portion has less energy than the bubble generated from the interior of the liquid or from the wall surface, and therefore the bubble generation preferentially originates at the concave portion.

According to the present invention, the concave portion is provided so that the solder powder is allowed to efficiently self-congregate into a space between electrodes or above the electrodes. Specifically, the concave portion is formed in the surface of the electronic component (except for a surface region where the electrodes are provided). The concave portion may be formed either over the entire surface of the electronic component or only in a necessary surface region, depending on the shape and arrangement of the electrodes thereof.

Hereinafter, "process for producing an electronic component assembly" and "process for producing an electronic component having solder bumps" will be described in more detail in accordance with the present invention. The following description will apply to both of "process for producing an electronic component assembly" and "process for producing an electronic component having solder bumps", unless otherwise stated. For example, the term "electronic component" means not only the first and second electronic components used in "processes for producing an electronic component assembly", but also the electronic component used in "process for producing an electronic component having solder bumps".

Figure 8:
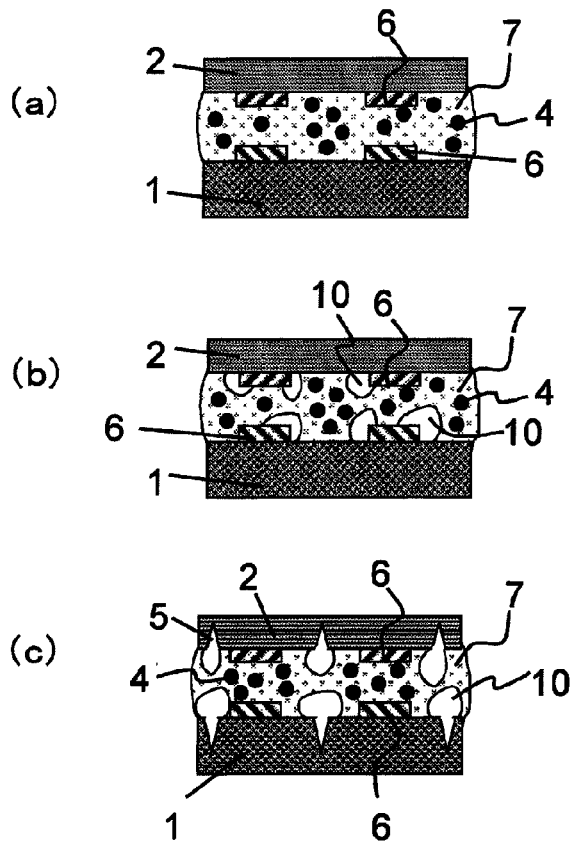
FIGS. 8(a) and 8(b) are diagrams schematically illustrating the form of bubble generation occurred in an electronic component having electrodes (i.e. electronic component with no concave portion)
FIG. 8(c) is a diagram schematically illustrating the form of bubble generation occurred in an electronic component having concave portions as well as electrodes.
Figure 9:
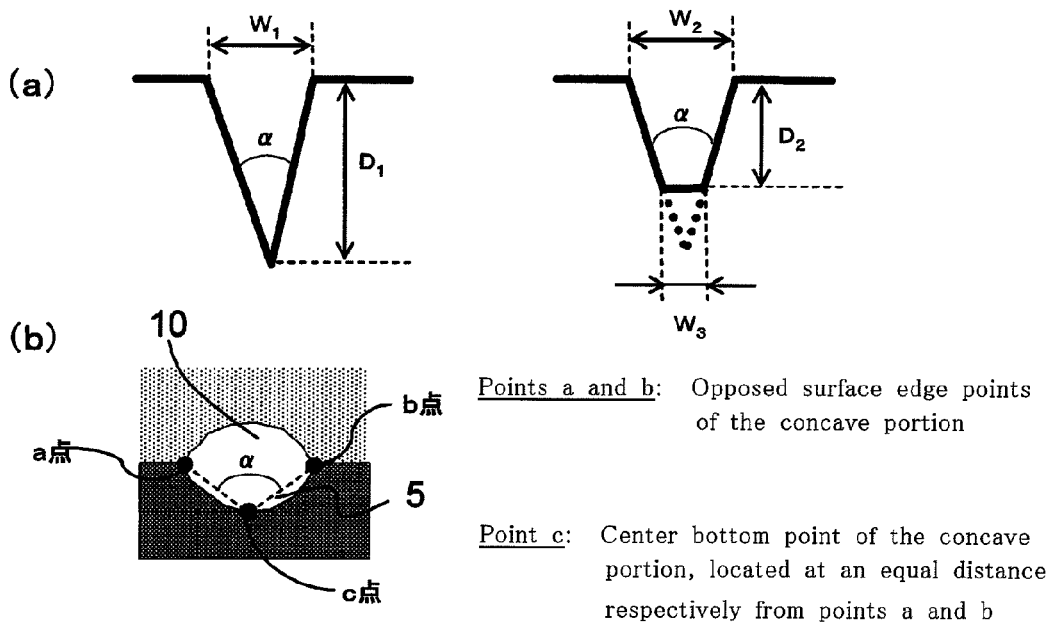
FIG. 9(a) is a diagram (sectional view) schematically showing a taper angle and dimensions of concave portion.
FIG. 9(b) is a diagram (sectional view) schematically showing a determination of the taper angle in a case where the concave portion is constructed in the form of curved surface or curved line.

First, with reference to FIG. 8 to FIG. 10, a preferable form of the concave portion will be described. For example, in a case where the electrodes are provided on the surface region of the electronic components and no concave portion is provided thereon as shown in FIG. 8(a), the electrodes form convex portions on the surface of the electronic component, and thereby the bubble generation tends to originate at a boundary region between the electronic component surface and the electrode (see FIG. 8(b)). This is due to the fact that an angle formed by a side surface of the electrode and the electronic component surface is 90 degrees so that the energy for bubble generation becomes smaller. Accordingly, in order to generate the bubble preferentially from the concave portion provided in the surface of the electronic component, it is preferable for the concave portion to have a tapered shape with a taper angle of less than 90 degrees as shown in FIG. 8(c). This tapered shape makes it possible to generate the bubbles from the concave portion with less energy than that required to generate the bubbles from the boundary region between the electronic component surface and the electrode. Namely, the tapered shape of the concave portion makes it possible to reduce the value of the above $U_2$ (r). More specifically, a taper angle α of the concave portion (see FIG. 9(a)) is preferably less than 90 degrees, more preferably in the range of from 10 to 85 degrees and still more preferably in the range from 50 to 80 degrees. A cross-sectional view of the concave portion may be "V" in shape. Alternatively, the cross-sectional view of the concave portion may be defined by a curved line, and thus may be "U" in shape. A surface by which the concave portion is defined may be either smooth or rough. In a case where the concave portion is defined by a curved surface or line as shown in FIG. 9(b), "taper angle" refers to an angle formed by "straight line connecting points a and c" and "straight line connecting points b and c" wherein the points a and b are opposed surface edge points of the concave portion, and the point c is a center bottom point of the concave portion, the point c being located at an equal distance respectively from the points a and b.

Figure 10:
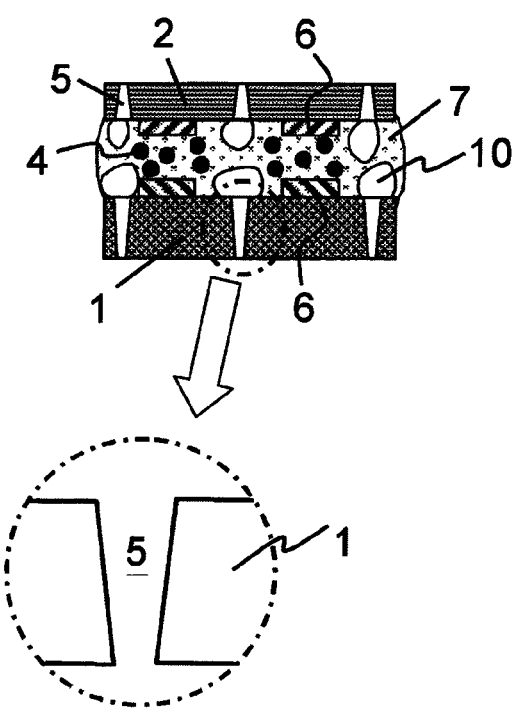
FIG. 10 is a schematic diagram illustrating the concave portions in the form of through-hole.

The concave portion may extend through the electronic component as a through-hole as shown in FIG. 10. This through-hole also has a function of preferentially generating bubbles therefrom. The concave portion preferably has a generally conical shape, truncated cone shape or quadrangular pyramid shape. In this case, it is made possible to reduce a ratio between the bubble volume and the gas bubble-liquid interfacial area with respect to the bubble generated from the concave portion. In other words, the substantially conical shape, truncated cone shape or quadrangular pyramid shape of the concave portion makes it possible to generate the bubble with a low energy that is less than that of the bubble generated at a boundary region between the electronic component surface and the electrode, which leads to a preferential bubble generation at the concave portion. Now, dimensions of the conical-shaped concave portion as shown on the left of FIG. 9(a) will be described. The width $W_1$ of the concave portion ($W_1$ is a dimension between opposed surface edge points of the concave portion wherein a line connecting such edge points with each other passes through the center of the concave portion) is suitably determined, depending on a pitch of the electrodes. For the reason of the bubble generation and the arrangement of the concave portion, it is preferable that $W_1$ is in the range of from 10 to 90 percent of the electrode spacing. For example, in a case where the pitch is 200 μm (L/S=100/100), $W_1$ is preferably in the range of from 10 to 90 μm. The depth $D_1$ of the concave portion is suitably determined, depending on the thickness of the electronic component. For example, the depth $D_1$ is preferably in the range of from 6 to 100 μm, more preferably in the range of from 10 to 50 μm. The depth $D_1$ may be preferably in the range of from 5 to 50 percent of the thickness of the electronic component. As for the dimensions of the truncated cone-shaped concave portion as shown on the right of FIG. 9(a), $W_2$ of the concave portion ($W_2$ is a dimension between opposed surface edge points of the concave portion wherein a line connecting such edge points with each other passes through the center of the concave portion) is suitably determined, depending on a pitch of the electrodes. For the reason of the bubble generation and the arrangement of the concave portion, it is preferable that $W_2$ is in the range of from 10 to 90 percent of the electrode spacing. The depth $D_2$ of the concave portion is suitably determined, depending on the thickness of the electronic component. For example, the depth $D_2$ is preferably in the range of from 6 to 100 μm, more preferably in the range of from 10 to 50 μm. The depth $D_2$ may be preferably in the range of from 5 to 50 percent of the thickness of the electronic component. In these regards, it is preferable to form the concave portion with an angle of less than 90 degrees by adjusting a relationship between $W_1$ and $D_1$ or a relationship between $W_2$, $W_3$ ($W_2 > W_3$) and $D_2$.

Most of the bubbles generate from the inside of the concave portion, but some of them may generate from the edge of the concave portion according to the circumstances (namely, the bubbles may generate at points "a" and "b" as shown in FIG. 9(b)).

Figure 11:
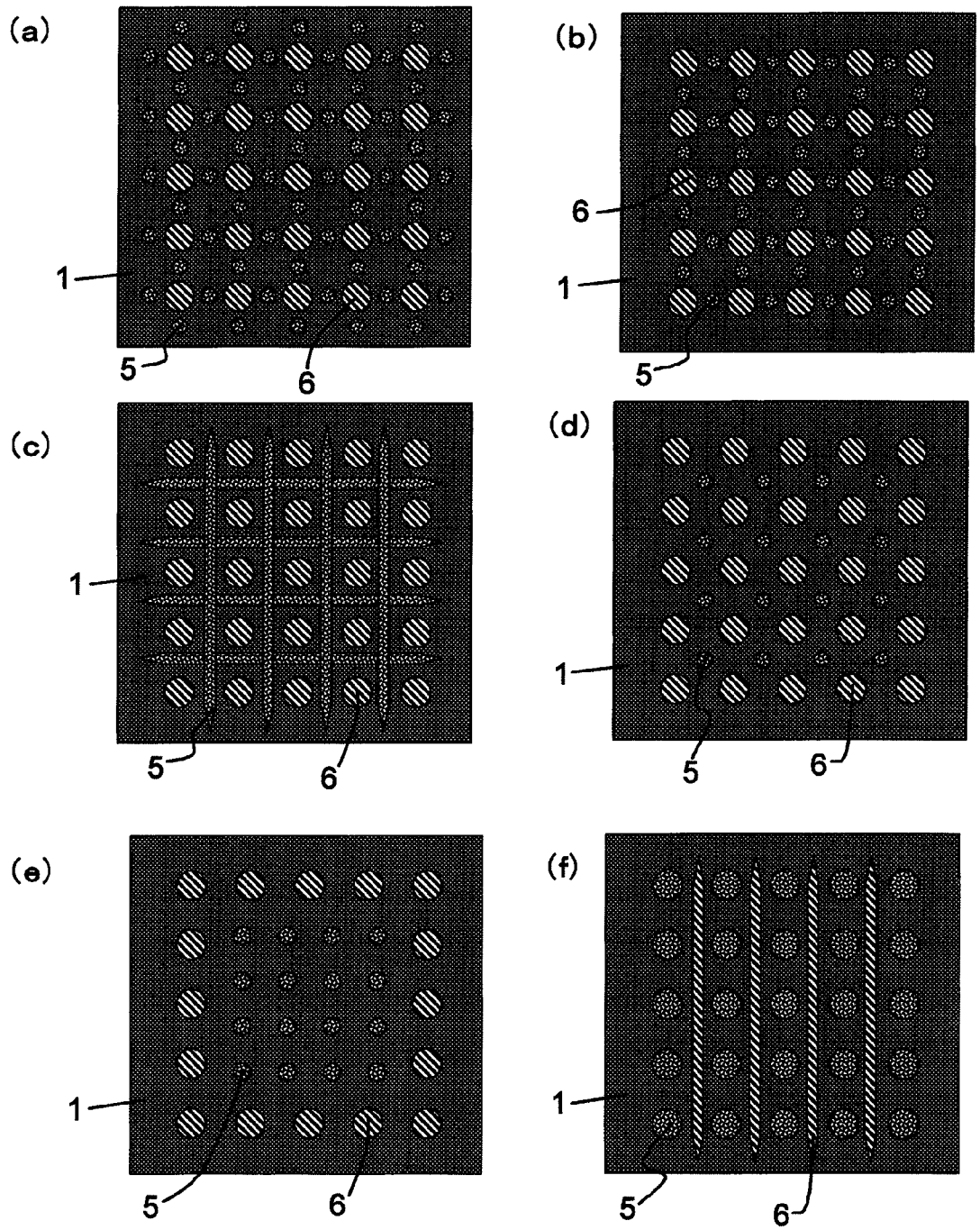
FIGS. 11(a) to 11(f) are top views of an electronic component schematically illustrating various arrangements of concave portions.

According to the present invention, the solder powder is allowed to congregate into a space between the electrodes or above the electrode, as described above. In this regard, the form of the bubble generation has a great influence on the resulting solder connections or solder bumps. While it is generally important for the bubbles to generate uniformly in an application range, it is more desirable that a residence time of bubbles above the electrodes is shorter. In light of this, the concave portions are provided in a surface region other than an electrode region thereof. For example, the arrangements of the concave portions may be ones as shown in FIGS. 11(a) to 11(f). Generally speaking, it is preferable to provide each of the concave portions in a central region between adjacent electrodes as shown in FIGS. 11(a), 11(b) and 11(d). In other words, it is preferable to provide the concave portion in a region located at equal distance from the neighboring electrodes. The concave portions may also be provided in the form of groove as shown in FIG. 11(c). The grooved concave portions have such an advantage that the generated bubbles are released along the grooves so that the resin and the solder powder can congregate into the space above the electrodes more effectively. The grooved concave portions can be easily formed by machining with a dicing machine or the like. It is noted that the arrangements and forms of the concave portions shown in FIG. 11 are mere examples, and many other forms and arrangements are possible.

Figure 12:
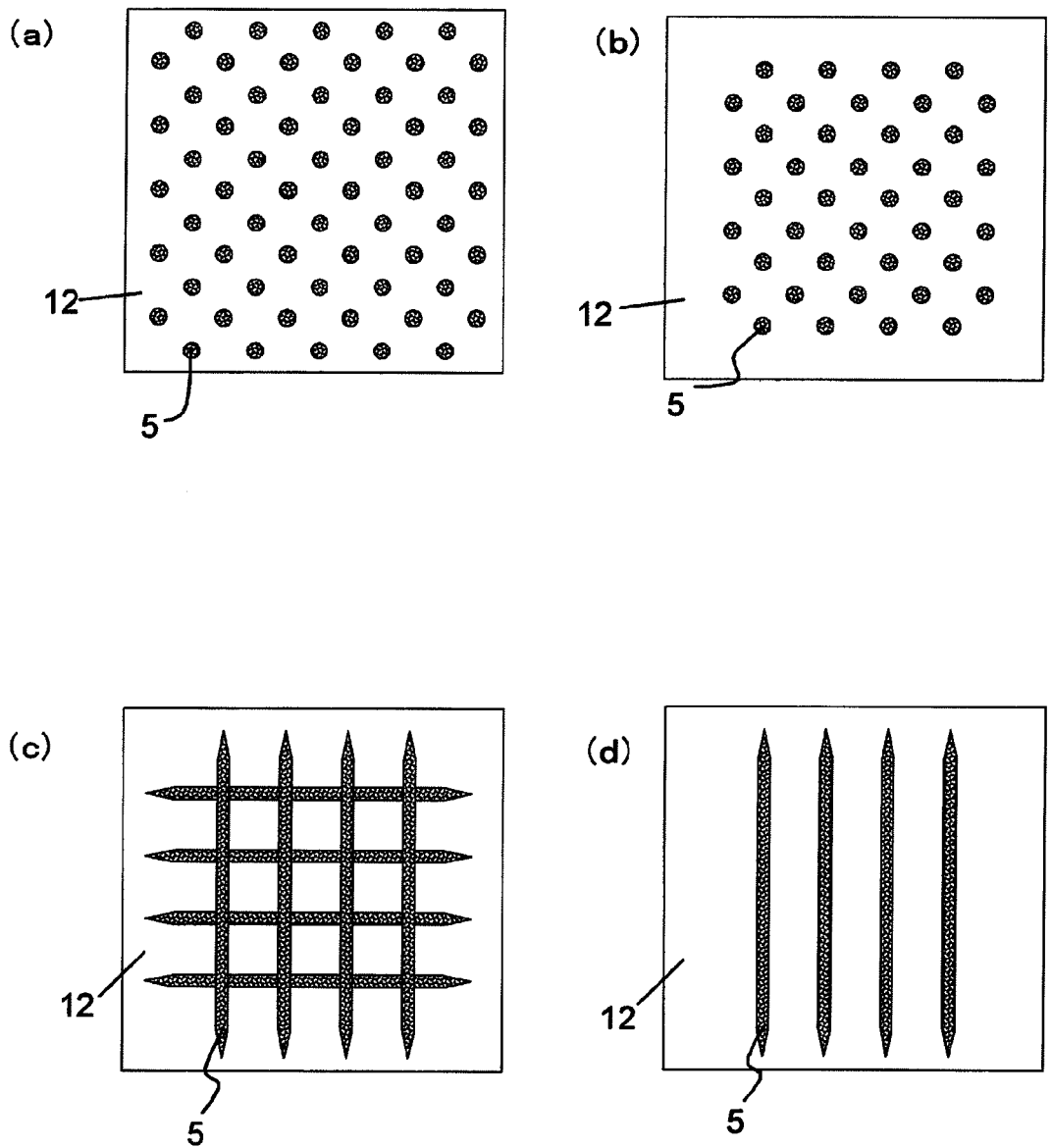
FIGS. 12(a) to 12(d) are top views of a flat plate schematically illustrating various arrangements of concave portions of the flat plate.

With respect to "process for producing an electronic component assembly" shown in FIG. 3, the concave portions for generating bubbles are formed in both of the first electronic component 1 and the second electronic component 2. However, the effect of the present invention can be provided by providing the concave portions only in any one of the first and second electronic components. As for "process for producing an electronic component having solder bumps" shown in FIGS. 4 and 5, the concave portions are formed in either the electronic component 1 or the flat plate 12. However, the concave portions may be also formed in both of the electronic component 1 and the flat plate 12, in which case the effect of the present invention is expected to be enhanced. The arrangements and forms of the concave portions of the flat plate 12 may be ones as shown in FIG. 12, for example.

In order to form the concave portion in the electronic component or flat plate, a laser machining may be employed, but the present invention is not limited to that. A mechanical means such as dicing machine, drilling or sandblast may also be employed. In addition, a chemical means such as etching and resist film may also be employed in order to form the concave portion in the electronic component or flat plate. It is of course possible to combine the above means with each other. When the concave portion is a through-hole, it is preferable to employ a machining process with a drill or puncher to form it. The sandblast can also be preferably employed since a large number of the concave portions are formed in desired positions of the electronic component. In a case where more concave portions are formed in larger surface region than that occupied by the electrodes of the electronic components, the effect of the present invention is expected to be enhanced.

Now, a source of the bubbles will be described. As described above, the bubbles are generated upon the heating step (4). The source of the bubbles may be a substance contained in the electronic component. For example, the electronic component may contain moisture that has been adsorbed or absorbed during the manufacturing process thereof, or may contain various types of substances such as "boiling-type of substance" and "decomposing-type of substance". As a result, the heating of the electronic component causes the substance contained therein to give off the bubbles. In a case where an organic solvent (e.g. butyl acetate or ethylene glycol) is used as a substance capable of generating gas, such substance may be intentionally added into the electronic component by immersing the electronic component in the organic solvent. Alternatively, water, "boiling-type of substance" and/or "decomposing-type of substance" may be added into the resin to be used in the step (2) (i.e. resin composition), in addition to the solder powder.

The boiling type of substance is capable of boiling and thus gasifying when heated. The boiling type of substance has a boiling point that is slightly lower than the melting point of the solder powder, preferably lower by 10 to 100° C., more preferably lower by 10 to 60° C. The boiling point of the boiling type of substance may be substantially the same as the melting point of the solder powder. Moreover, the boiling point of the boiling type of substance may be slightly higher than the melting point of the solder powder, preferably higher by 10 to 100° C., more preferably higher by 10 to 20° C. For example, the boiling type of substance is at least one kind of substance selected from the group consisting of hexane, vinyl acetate, isopropyl alcohol, butyl acetate, propionic acid, ethylene glycol, N-methyl-2-pyrrolidone, α-terpineol, butyl carbitol, butyl carbitol acetate and diethylene glycol dimethyl ether. Water may also be regarded as the boiling type of substance.

The decomposing type of substance is capable of decomposing and thereby releasing gas when heated. Similarly to the case of the boiling type, the decomposing type of substance has a decomposition temperature that is slightly lower than the melting point of the solder powder, preferably lower by 10 to 100° C., more preferably lower by 10 to 60° C. The decomposition temperature of the decomposing type of substance may be substantially the same as the melting point of the solder powder. Moreover, the decomposition temperature of the decomposing type of substance may be slightly higher than the melting point of the solder powder, preferably higher by 10 to 100° C., more preferably higher by 10 to 20° C. For example, the decomposing type of substance is at least one kind of substance selected from the group consisting of aluminum hydroxide, dawsonite, ammonium metaborate, barium metaborate, azodicarbonamide (ADCA), sodium hydrocarbonate, aluminum hydroxide, calcium aluminate, boric acid, N,N'-dinitrosopentamethylenetetramine (DPT) and 4,4'-oxybis(benzene sulfonyl hydrazide) (OBSH).

In one embodiment, the generated bubbles are allowed to move within the resin between the first and second electronic components (in the case of "process for producing an electronic component assembly") or between the electronic component and the flat plate (in the case of "process for producing an electronic component having solder bumps"), and finally migrate to outside through a periphery of the gap formed therebetween.

Hereinafter, the various components and steps used in "process for producing an electronic component assembly" and "process for producing an electronic component having solder bumps" according to the present invention will be described in more detail. Moreover, the electronic component assembly and the electronic component having solder bumps, both of which can be obtained from the above processes, will also be described in more detail.

(Electronic Component)

The electronic component (e.g. the first electronic component and the second electronic component in the case of "process for producing an electronic component assembly") is preferably a semiconductor, a circuit substrate (e.g. printed wiring substrate, ceramic substrate or glass substrate), a module component or a passive component. In this regard, however, there is no limit on the kind of the electronic component as long as it is commonly used as a general electronic component. For example, as for "process for producing an electronic component assembly", the first electronic component 1 may be a circuit substrate and the second electronic component 2 may be a semiconductor, which leads to an achievement of a flip-chip mounting. Alternatively, both of the first electronic component 1 and the second electronic component 2 may be a circuit substrate, which leads to an interconnection of the substrates.

(Solder Powder)

The solder powder 4 is a constituent of the resin composition used in the step (2) of "process for producing an electronic component assembly" and "process for producing an electronic component having solder bumps" according to the present invention. Such solder powder 4 may be not only a conventional lead-containing solders (e.g. SnPb) but also a lead-free solders (e.g. SnAgCu, SnAg, SnAgBiIn, SnSb and SnBi), however the present invention is not limited to that. The mean particle size of the solder powder is preferably in the range of from 1 to 50 μm, but the present invention is not limited to that.

It is preferable that the particles of the solder powder have substantially the same size as each other. In general, the melting point of the solder powder is in the range of preferably from 100 to 300° C., more preferably from 130 to 280° C.

The content of the solder powder contained in the resin composition is in the range of usually from 0.5 to 30% by volume, preferably from 0.5 to 20% by volume. The value of "percentage by volume" is based on the volume of the resin composition (i.e. resin composition consisting of a resin and a solder powder).

(Resin)

As the resin (i.e. resin component 7 of the resin composition 3) of the step (2), a thermosetting resin or a thermoplastic resin may be used. It is preferable that the viscosity of the resin decreases upon the heating step (4) so that the solder powder can move easily. In a case of the thermosetting resin, a curing process may be initiated upon the heating, but the curing process must not proceed to such an extent that the movement of the bubbles is hampered. That is to say, it is preferable that the progression of the curing process is substantially curbed in the heating step. On the other hand, after the formation of the solder connections and solder bumps is completed, the curing process may proceed or terminate by further heating the electronic component or flat plate.

The thermosetting resin may be at least one kind of resin selected from the group consisting of epoxy resin, phenol resin, silicone resin and melamine resin, but the present invention is not limited to that. Thermoplastic resin may be at least one kind of resin selected from the group consisting of polyamide, polycarbonate, polyethylene terephthalate and polyphenylene sulfide. In a case where a washing process/cleaning process is performed, a silicone oil, a glycerin and a hydrocarbon-based oil may also be used.

In a case where a thermoplastic resin is used as the resin for "process for producing an electronic component assembly" of the present invention, the first electronic component 1 and the second electronic component 2 are secured to each other by solidifying the resin 7 after the self-congregation of the solder powder is completed. In this case, the resin is heated to a softening point or higher so that the solder powder is allowed to self-congregate, followed by a cooling thereof. This cooling causes the softened resin to solidify again, and thereby the first electronic component 1 and the second electronic component 2 are secured to each other.

Alternatively, a curing agent may be added to the resin composition 3, in which case the resin can be cured after the self-congregation of the solder powder is completed, and thereby the first electronic component 1 and the second electronic component 2 are secured to each other. In this case, it is preferable to cause the curing of the resin and the self-congregation of the solder powder to proceed separately as far as possible by controlling a curing rate of the resin with the curing agent to be slower than a congregating rate of the solder powder. In order to cure the resin, not only the thermal curing but also a photocuring may be preferably employed. In the case of the photocuring, a UV-setting resin such as a light-curable epoxy resin can be used, in which case the resin can be cured by irradiating with ultraviolet rays. The curing process may not only consist of the single-stage curing, but also consist of the two-stage curing including "B-stage".

(Flat Plate)

The flat plate is put into contact with the supplied resin of the step (3) in "process for producing an electronic component having solder bumps" according to the present invention. The flat plate has a function of minimizing a dispersion of the bubbles generated in the step (4) to the outside. As described above, in the case where the concave portions are provided in the flat plate, the bubble generation originates from the concave portions of the flat plate. That is to say, the bubbles are generated at the desired positions of the flat plate surface. As described with respect to the third embodiment, when the flat plate is put into contact with the resin, it is preferable to locate the flat plate such that the concave portions of the flat plate are opposed to the no-electrode surface region of the electronic component where there is no electrode provided (hereinafter, such surface region is also referred to as "no-electrode surface"). In a case the concave portions are also provided in the electronic component, it is preferable to locate the flat plate such that the concave portions of the flat plate are opposed to the concave portions of the electronic component respectively. In this case, the generation points of the bubbles are located away from the electrodes, and thereby it becomes easier for the solder powder to congregate toward the electrodes. This leads to an achievement of an improved congregation of the solder powder.

Comprehensively speaking, with respect to "process for producing an electronic component having solder bumps" according to the present invention, it is preferable to form the concave portions in the flat plate in such an arrangement that enables them to oppose "no-electrode surface" of the electronic component. On that basis, the flat plate can be put into contact with the surface of the resin in the step (3) such that the concave portions of the flat plate are opposed to "no-electrode surface" of the electronic component.

In the step (4), a contact between the flat plate and the resin surface is maintained. Preferably, a constant pressure may be applied to the flat plate so that the flat plate would not be displaced from the contact position during the step (4). The flat plate is removed by moving it away from the resin surface after the formation of the solder bumps is completed. In light of this, the flat plate is preferably made of a material having release properties capable of releasing from the resin. For example, the flat plate may be made of a glass, a resin (e.g. polypropylene resin), a silicone, a metal or a composite of these materials. The flat plate may also have a layer consisting of releasing agent provided on the surface thereof.

(Supply of Resin)

In the step (2), the resin composition is supplied so as to cover the plurality of electrodes of the electronic component. The resin composition may be supplied by any suitable means, such as a dispenser. Upon supplying the resin composition, each of the concave portions may or may not be filled with the resin. In this regard, for example, at least a part of the concave portion may be filled with the resin.

(Heating)

The heating step (4) is carried out by heating the first electronic component and/or the second electronic component from the outside in the case of "process for producing an electronic component assembly", or by heating the flat plate and/or the electronic component from the outside in the case of "process for producing an electronic component having solder bumps". The heating of the electronic component and/or flat plate causes the supplied resin to be heated. The intermediate product obtained from the step (3) may also be put in a heating atmosphere (e.g. an oven) and heated as it is. This heating operation is carried out while keeping the second electronic component (in the case of "process for producing an electronic component assembly") or the flat plate (in the case of "process for producing an electronic component having solder bumps") in contact with the resin surface. By so doing, the generated bubbles can be prevented from escaping through the resin surface to the outside. By holding the second electronic component so as not to be displaced from the first electronic component (in the case of "process for producing an electronic component assembly"), or by holding the flat plate so as not to be displaced from the electronic component (in the case of "process for producing an electronic component having solder bumps"), the solder connections or solder bumps can be formed without deformation. For the purpose of holding the second electronic component or flat plate, any suitable means such as mechanical holding, adsorption, adhesion or the like may be employed.

It is necessary to heat the first electronic component and/or the second electronic component (in the case of "process for producing an electronic component assembly") or heat the flat plate and/or the electronic component (in the case of "process for producing an electronic component having solder bumps") to a predetermined temperature that is at least higher than the boiling point or decomposition temperature of "substance capable of generating gas" and at least higher than the melting point of the solder powder. Specifically, the heating temperature is in the range of from 100 to 400° C., and more preferably from 130 to 300° C. Heating time required for the solder congregation is in the range of preferably from 1 second to 1 minute, and preferably from 3 seconds to 20 seconds.

(Electronic Component Assembly)

By performing the process for producing an electronic component assembly according to present invention, there is provided an electronic component assembly comprising:

a first electronic component comprising a plurality of electrodes (a) provided on a surface (A) thereof;

a second electronic component comprising a plurality of electrodes (b) provided on a surface (B) thereof; and solder connections disposed between the plurality of electrodes (a) and the plurality of electrodes (b), the solder connections serving to electrically interconnect the electrodes (a) and (b), wherein at least one concave portion has been formed in the surface (A) (except for a surface region on which the electrodes (a) are provided) and/or the surface (B) (except for a surface region on which the electrodes (b) are provided) (see FIG. 3(e)). This electronic component assembly is characterized in that at least one concave portion is provided in the surface of the first electronic component and/or the second electronic component (except for the surface region where the electrodes are provided). Due to this characteristic, the generation points of the bubble have been controlled, so that the movement and congregation of the solder powder into a space between the electrodes has been performed uniformly upon the producing thereof. This results in more uniform solder connections. The description on "concave portion" has already been given in relation to "process for producing an electronic component assembly", and thus will be omitted here to avoid duplication.

As to the electronic component assembly, there is provided a resin between the first electronic component and the second electronic component. The first electronic component and the second electronic component are preferably secured to each other by the resin.

Description on the other elements as well as the feature associated with the electronic component assembly have already been given in relation to "process for producing an electronic component assembly", and thus will be omitted here to avoid duplication.

(Substrate Having Solder Bumps)

By performing the process for producing an electronic component having solder bumps, there is provided an electronic component having solder bumps comprising:

an electronic component comprising a plurality of electrodes on a surface thereof; and a plurality of solder bumps formed on the plurality of electrodes, wherein at least one concave portion has been formed in the surface of the electronic component (except for a surface region on which the electrodes are provided) (see FIG. 4(f) and FIG. 5(f)). This electronic component having solder bumps is characterized in that at least one concave portion is provided in the surface of the electronic component (except for the surface region where the electrodes are provided). Due to this characteristic, the generation points of the bubble have been controlled, so that the movement and congregation of the solder powder into the space above the electrodes has been performed uniformly upon the producing thereof. This results in more uniform solder bumps. Particularly the solder bumps are characterized by more uniform height, and namely there is less variability in height among the solder bumps.

Description on "concave portion" has been given in relation to "process for producing an electronic component having solder bumps", and thus will be omitted here to avoid duplication. Also, description on the other elements as well as the feature associated with "electronic component having solder bumps" have been given in relation to "process for producing an electronic component having solder bumps", and thus will be omitted here to avoid duplication.

Figure 13:
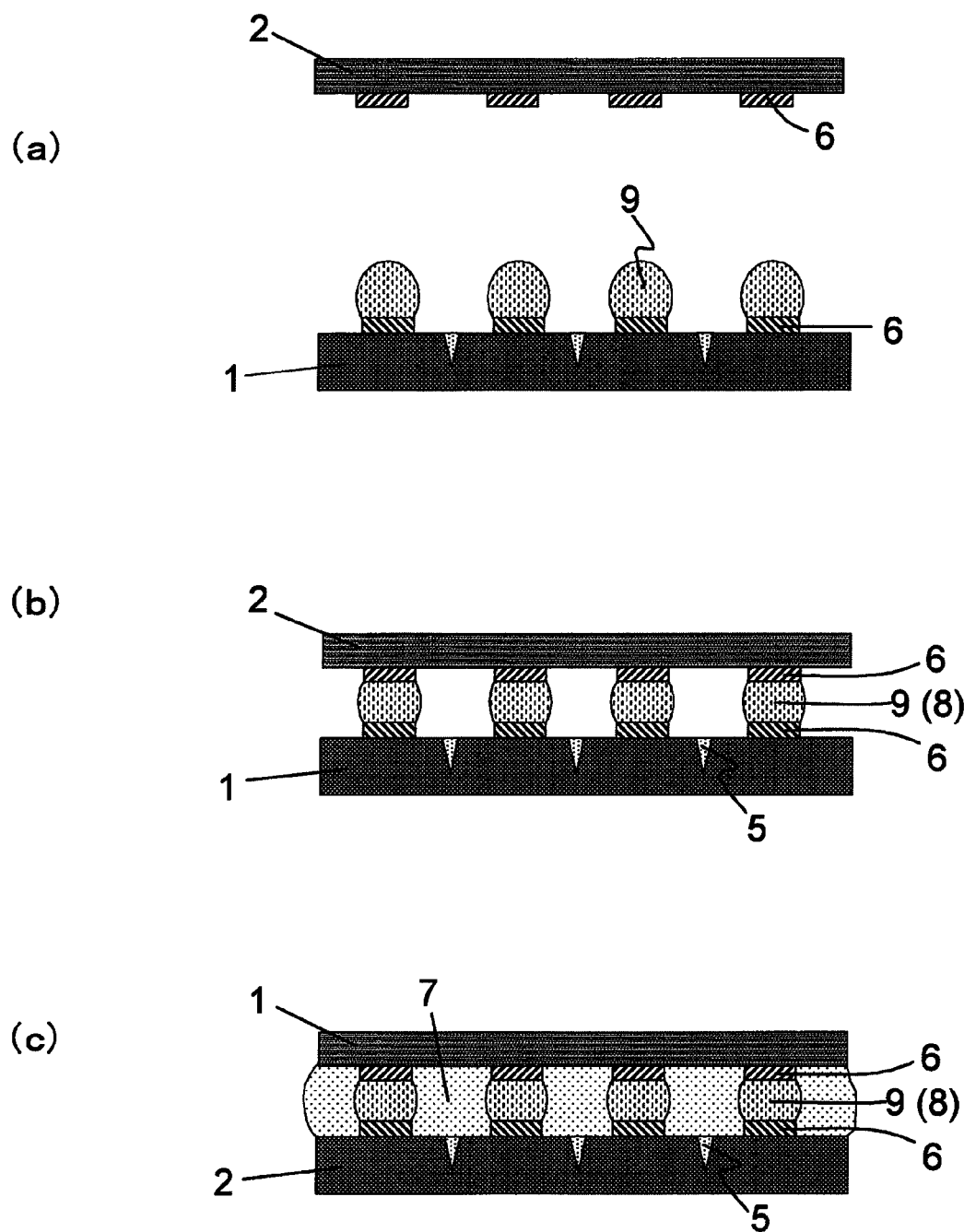
FIGS. 13(a) to 13(c) are sectional views illustrating a mounting process for producing an electronic component assembly with the use of electronic components having solder bumps according to the present invention.

Now, amounting process by the use of the electronic component having solder bumps will be described with reference to FIGS. 13(a) to 13(c). First, as shown in FIG. 13(a), an electronic component having solder bumps (which has been produced by performing the steps illustrated in FIG. 4, for example) and the second electronic component 2 are prepared. Then, as shown in FIG. 13(b), the second electronic component 2 is mounted over the electronic component having solder bumps such that the electrodes 6 of the second electronic component 2 are in contact with the solder bumps 9 of the electronic component having solder bumps. They are subsequently heated to a temperature enabling the solder to melt, or a pressure is applied thereto, and thereby the electrodes of the electronic component having solder bumps (i.e. the electrodes 6 of the first electronic component 1) and the electrodes 6 of the second electronic component 2 are electrically interconnected via the solder bumps 9. Lastly, the resin 7 is supplied between the electronic component having solder bumps and the second electronic component 2, thereby the electronic component assembly as shown in FIG. 13(*c*) is obtained. The oxide film, which may be formed on the solder bumps, can be removed by applying a removing agent therefor (e.g. flux) onto the electrodes 6 of the second electronic component 2 or the solder bumps, or by performing a plasma treatment.

Although a few exemplary embodiments of the present invention have been hereinbefore described, they are not to be construed as limiting thereof. Thus, those skilled in the art will readily appreciate that various modifications are possible.

The present invention as described above includes the following aspects:

First aspect: A process for producing an electronic component assembly wherein a plurality of electrodes (a) provided on a surface (A) of a first electronic component and a plurality of electrodes (b) provided on a surface (B) of a second electronic component are electrically interconnected by means of a solder, the process comprising the steps of:

(1) preparing a first electronic component whose surface (A) is provided with a plurality of electrodes (a) and a second electronic component whose surface (B) is provided with a plurality of electrodes (b) wherein at least one concave portion is formed in the surface (A) (except for a surface region on which the electrodes (a) are provided) and/or the surface (B) (except for a surface region on which the electrodes (b) are provided);

(2) supplying a resin that comprises a solder powder onto the surface (A) of the first electronic component;

(3) bringing the second electronic component into contact with a surface of the resin supplied in the step (2) such that the plurality of electrodes (a) of the first electronic component are respectively opposed to the plurality of electrodes (b) of the second electronic component; and (4) heating the first electronic component and/or the second electronic component while keeping the second electronic component in contact with the surface of the supplied resin, and thereby forming solder connections from the solder powder, the solder connections serving to electrically interconnect the electrodes (a) and (b), wherein, upon the heating step (4), gas bubbles are generated within the resin such that the bubble generation originates at least from the concave portion, and the generated bubbles force the solder powder to move and congregate onto the electrodes (a) and (b).

Second aspect: The process according to the first aspect, wherein the concave portion has a tapered shape with a taper angle of less than 90 degrees.

Third aspect: The process according to the first or the second aspect, wherein the concave portion is constructed in the form of a groove.

Fourth aspect: The process according to any one of the first to the third aspects, wherein the concave portion is configured to extend through the first electronic component and/or the second electronic component.

Fifth aspect: The process according to anyone of the first to the fourth aspects, wherein the concave portion is formed in a central region between the adjacent electrodes (a) and/or in a central region between the adjacent electrodes (b).

Sixth aspect: The process according to anyone of the first to the fifth aspects, wherein the concave portion is formed by laser machining on the surface (A) of the first electronic component and/or the surface (B) of the second electronic component.

Seventh aspect: The process according to any one of the first to the sixth aspects, wherein the gas bubbles are produced from "substance capable of generating gas" contained in the first electronic component and/or the second electronic component.

Eighth aspect: The process according to any one of the first to the sixth aspects, wherein the gas bubbles are produced from "substance capable of generating gas" contained in the resin supplied in the step (2).

Ninth aspect: The process according to the seventh or eighth aspect, wherein the substance capable of generating gas is at least one kind of substance selected from the group consisting of water, hexane, vinyl acetate, isopropyl alcohol, butyl acetate, propionic acid, ethylene glycol, N-methyl-2-pyrrolidone, α-terpineol, butyl carbitol, butyl carbitol acetate and diethylene glycol dimethyl ether.

Tenth aspect: The process according to the seventh or the eighth aspect, wherein the substance capable of generating gas is at least one kind of substance selected from the group consisting of aluminum hydroxide, dawsonite, ammonium metaborate, barium metaborate, azodicarbonamide, sodium hydrocarbonate, aluminum hydroxide, calcium aluminate, boric acid, N,N'-dinitrosopentamethylenetetramine and 4,4'-oxybis(benzene sulfonyl hydrazide).

Eleventh aspect: An electronic component assembly comprises:

a first electronic component comprising a plurality of electrodes (a) provided on a surface (A) thereof;

a second electronic component comprising a plurality of electrodes (b) provided on a surface (B) thereof; and solder connections disposed between the plurality of electrodes (a) and the plurality of electrodes (b) to electrically interconnect the electrodes (a) and (b), wherein at least one concave portion is formed in the surface (A) (except for a surface region on which the electrodes (a) are provided) and/or the surface (B) (except for a surface region on which the electrodes (b) are provided).

Twelfth aspect: The electronic component assembly according to the eleventh aspect, wherein the concave portion has a tapered shape with a taper angle of less than 90 degrees.

Thirteenth aspect: The electronic component assembly according to the eleventh or the twelfth aspect, wherein the concave portion is constructed in the form of a groove.

Fourteenth aspect: the electronic component assembly according to any one of the eleventh to the thirteenth aspects, wherein the concave portion is configured to extend through the first electronic component and/or the second electronic component.

Fifteenth aspect: The electronic component assembly according to any one of the eleventh to the fourteenth aspects, wherein the concave portion is formed in a central region between the adjacent electrodes (a) and/or in a central region between the adjacent electrodes (b).

Sixteenth aspect: A process for producing an electronic component having solder bumps, comprising the steps of:

(1) preparing an electronic component wherein a plurality of electrodes are provided on a surface thereof, and at least one concave portion is formed in the surface (except for a surface region on which the electrodes are provided);

(2) supplying a resin that comprises a solder powder onto the surface of the electronic component;

(3) bringing a flat plate into contact with a surface of the resin supplied in the step (2); and (4) heating the electronic component and/or the flat plate while keeping the flat plate in contact with the surface of the supplied resin, and thereby forming solder bumps on the electrodes, wherein, upon the heating step (4), gas bubbles are generated within the resin such that the bubble generation originates at least from the concave portion, and the generated bubbles force the solder powder to move and congregate onto the electrodes.

Seventeenth aspect: The process according to the sixteenth aspect, wherein the concave portion has a tapered shape with a taper angle of less than 90 degrees.

Eighteenth aspect: The process according to the sixteenth or the seventeenth aspect, wherein the concave portion is constructed in the form of a groove.

Nineteenth aspect: The process according to any one of the sixteenth to the eighteenth aspects, wherein the concave portion is configured to extend through the electronic component.

Twentieth aspect: The process according to any one of the sixteenth to the nineteenth aspects, wherein the concave portion is formed in a central region between the adjacent electrodes.

Twenty first aspect: The process according to any one of the sixteenth to twentieth aspects, wherein the concave portion is formed on the surface of the electronic component by laser machining.

Twenty second aspect: The process according to any one of the sixteenth to the twenty first aspects, wherein another at least one concave portion is formed in a surface of the flat plate; and in the step (3), the flat plate is brought into contact with the surface of the supplied resin such that the concave portion of the flat plate is opposed to a surface region of the electronic component where there is no electrode provided.

Twenty third aspect: the process according to any one of the sixteenth to the twenty second aspect, wherein the gas bubbles are produced from "substance capable of generating gas" contained in the electronic component.

Twenty fourth aspect: The process according to any one of the sixteenth to the twenty second aspects, wherein the gas bubbles are generated from "substance capable of generating gas" contained in the resin supplied in the step (2).

Twenty fifth aspect: the process according to the twenty third or twenty fourth aspect, wherein the substance capable of generating gas is at least one kind of substance selected from the group consisting of water, hexane, vinyl acetate, isopropyl alcohol, butyl acetate, propionic acid, ethylene glycol, N-methyl-2-pyrrolidone, α-terpineol, butyl carbitol, butyl carbitol acetate and diethylene glycol dimethyl ether.

Twenty sixth aspect: The process according to the twenty third or the twenty fourth aspect, wherein the substance capable of generating gas is at least one kind of substance selected from the group consisting of aluminum hydroxide, dawsonite, ammonium metaborate, barium metaborate, azodicarbonamide, sodium hydrocarbonate, aluminum hydroxide, calcium aluminate, boric acid, N,N'-dinitrosopentamethylenetetramine and 4,4'-oxybis(benzene sulfonyl hydrazide).

Twenty seventh aspect: An electronic component with solder bumps comprises:

an electronic component comprising a plurality of electrodes on a surface thereof; and a plurality of solder bumps formed on the plurality of electrodes, wherein at least one concave portion is formed in the surface of the electronic component (except for a surface region on which the electrodes are provided).

Twenty eighth aspect: The electronic component with solder bumps according to the twenty seventh aspect, wherein the concave portion has a tapered shape with a taper angle of less than 90 degrees.

Twenty ninth aspect: The electronic component with solder bumps according to the twenty seventh or the twenty eighth aspect, wherein the concave portion is constructed in the form of a groove.

Thirtieth aspect: The electronic component with solder bumps according to any one of the twenty seventh to twenty ninth aspects, wherein the concave portion is configured to extend through the electronic component.

Thirty first aspect: The electronic component with solder bumps according to any one of the twenty seventh to thirtieth aspects, wherein the concave portion is formed in a central region between the adjacent electrodes.

Thirty second aspect: A process for producing an electronic component having solder bumps, comprising the steps of:

(1) preparing an electronic component wherein a plurality of electrodes are provided on a surface thereof;

(2) supplying a resin that comprises a solder powder onto the surface of the electronic component;

(3) bringing a flat plate into contact with a surface of the resin supplied in the step (2); and (4) heating the electronic component and/or the flat plate while keeping the flat plate in contact with the surface of the supplied resin, and thereby forming solder bumps on the electrodes, wherein at least one concave portion is formed in the surface of the flat plate;

in the step (3), the flat plate is brought into contact with the surface of the supplied resin such that the concave portion of the flat plate is opposed to a surface region of the electronic component where there is no electrode provided; and upon the heating step (4), gas bubbles are generated within the resin such that the bubble generation originates at least from the concave portion, and the generated bubbles force the solder powder to move and congregate onto the electrodes.

EXAMPLES

Example 1

In Example 1, an electronic component assembly was produced by the use of two electronic components having concave portions formed in the surfaces thereof. Specifically, the electronic component assembly as shown in FIG. 3(e) was produced according to the above first embodiment of "process for producing an electronic component assembly".

Figure 14:
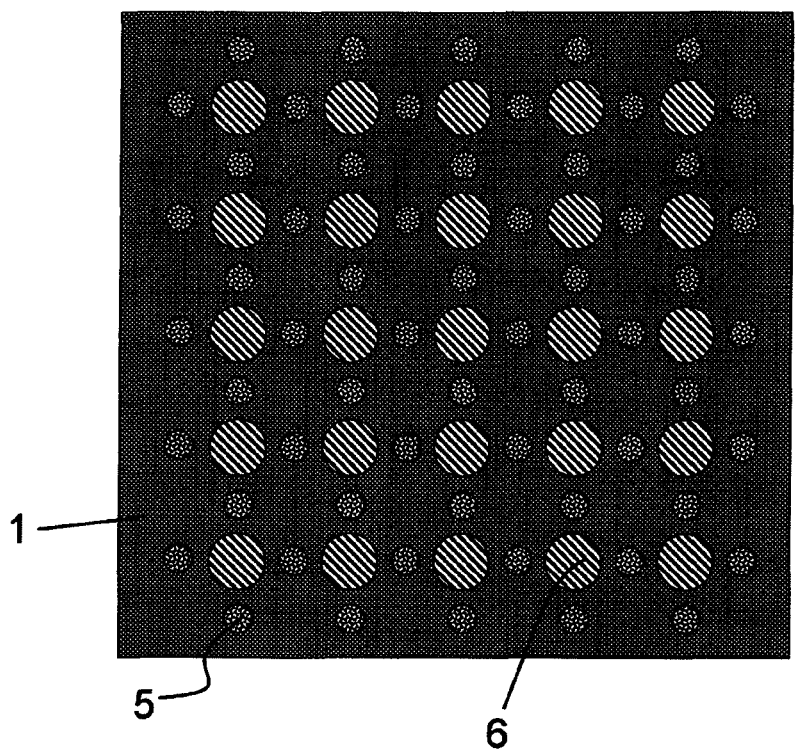
FIG. 14 is a top view schematically illustrating a circuit substrate having concave portions, which was used in Example 1.

As the first electronic component, a circuit substrate of 10 mm×10 mm (buildup substrate, 25 electrodes (5×5) disposed at 200 μm pitch, each of electrodes measuring 100 μmφ in diameter) was prepared. As the second electronic component, a semiconductor TEG chip (25 electrodes (10× 10) disposed at 200 μm pitch, each of electrodes measuring 100 μmφ in diameter) was prepared. The prepared circuit substrate had the concave portions formed in an arrangement pattern shown in FIG. 14 on the surface thereof. The concave portions were formed by laser machining upon the manufacturing process of the circuit substrate. As a laser machine, a machine with YAG laser (wavelength 355 nm, the controller thereof manufactured by Matsushita Electric Industrial Co., Ltd.) was used. Each of the concave portions had truncated cone shape measuring 50 μmφ in diameter at the surface, 40 μm at the bottom and 100 μm in depth. No concave portion was provided in the semiconductor TEG chip.

The solder resin mixture to be applied onto the circuit substrate was prepared by mixing SnAgCu (particle size: 30 μm) as the solder powder and diethylene glycol dimethyl ether (manufactured by Wako Pure Chemical Industries, Ltd.) as "substance capable of generating gas" with a resin mixture consisting of bisphenol F epoxy resin (Epicoat 806, manufactured by Japan Epoxy Resins Co., Ltd.) and imidazole-based curing agent (manufactured by Shikoku Chemicals Corporation) (57% by weight of resin, 40% by weight of solder powder and 3% by weight of substance capable of generating gas).

First, the solder resin mixture 3 was applied onto the circuit substrate (i.e. the first electronic component 1) as shown in FIG. 3(b), and thereafter the semiconductor (i.e. the second electronic component 2) was mounted and positioned over the circuit substrate as shown in FIG. 3(c) wherein the electrodes of the circuit substrate were respectively opposed to the electrodes of the semiconductor. Subsequently, the circuit substrate and the semiconductor TEG chip were heated to 250° C. so as to boil "substance capable of generating gas", and thereby the gas bubbles were produced therefrom.

As the generated bubbles continued moving within the resin, the solder powder was allowed to self-congregate into a region between the electrodes so as to eventually form the solder connections. By continuing to heat at 200° C., the resin composition was cured so as to secure the semiconductor and the circuit substrate to each other (heating time was 10 minutes in total). As a result, the electronic component assembly as shown in FIG. 3(e) was obtained.

Example 2

In Example 2, an electronic component assembly was produced in a similar way to Example 1, except that two circuit substrates were used as the first electronic component and the second electronic component. Specifically, the electronic component assembly as shown in FIG. 3(e) was produced through the steps illustrated in FIGS. 3(a) to 3(e). While the circuit substrates were of the same specifications as those of Example 1, the concave portion of quadrangular pyramid shape measuring by 50 μm at the bottom and 20 μm in depth had been formed by covering the surface of the circuit substrate with a resist film.

In Example 2, the circuit substrates was heated to 240° C. and then this temperature was maintained for 30 seconds so as to cause the solder powder to self-congregate onto the electrodes, and thereby forming the solder connections. Thereafter, the circuit substrates were subject to the heat treatment at 150° C. for 1 hour so as to cure the resin and thereby securing the circuit substrates to each other. As a result, the electronic component assembly as shown in FIG. 3(e) was obtained.

Example 3

In Example 3, an electronic component having solder bumps was produced by the use of a circuit substrate having concave portions formed in the surface thereof. Specifically, such electronic component was produced through the steps illustrated in FIG. 4.

The solder resin mixture to be applied onto the circuit substrate was prepared by mixing SnAgCu (particle size: 17 μm) as the solder powder and diethylene glycol dimethyl ether (manufactured by Wako Pure Chemical Industries, Ltd.) as "substance capable of generating gas" with a silicone resin (methylphenyl silicone oil KF54, manufactured by Shin-Etsu Silicone Co., Ltd.) (55% by weight of resin, 40% by weight of solder powder and 5% by weight of "substance capable of generating gas"). The circuit substrate was of the same specifications as that of Example 1. As the flat plate, a transparent glass sheet (measuring 10 mm×10 mm×1 mm$^t$, manufactured by Matsunami Glass Ind., Ltd.) was used.

First, the solder resin mixture was applied onto the circuit substrate as shown in FIG. 4(b), and thereafter the glass plate was put into contact with the surface of the resin as shown in FIG. 4(c). After heating the circuit substrate to 240° C. while keeping the glass plate in contact with the surface of the resin, this temperature was maintained for 30 seconds so as to boil "substance capable of generating gas", and thereby producing the gas bubbles therefrom.

As the generated bubbles continued moving within the resin, the solder powder was allowed to self-congregate onto the electrodes so as to eventually form the solder bumps. The state of the bubble generation was observed from above though the transparent glass plate. After the formation of the solder bumps was completed, the glass plate was removed from the surface of the resin. Thereafter, a washing treatment was performed with isopropyl alcohol to remove the resin component from the surface of the circuit substrate. As a result, the electronic component having the solder bumps as shown in FIG. 4(f) was obtained.

Example 4

In Example 4, an electronic component having solder bumps was produced by the use of a flat plate having concave portions formed on the surface thereof. Specifically, such electronic component was produced through the steps illustrated in FIG. 5.

As the flat plate, a transparent glass sheet (10 mm×10 mm×1 mm$^t$, manufactured by Matsunami Glass Ind., Ltd.) having the concave portions formed in a pattern shown in FIGS. 15(a) and 15(b) was used. The concave portions of the flat plate were formed by machining with a dicing machine (model DAD520, manufactured by DISCO Inc.). Each of the concave portion had truncated cone shape measuring 30 μmφ in diameter at the surface, 15 μm at the bottom and 20 μm in depth.

As the electronic component, the circuit substrate having specifications similar to that of Example 1 was used, wherein no concave portion was provided. As the resin composition, a solder resin mixture similar to that of Example 3 was used.

First, the solder resin mixture was applied onto the circuit substrate as shown in FIG. 5(b), and thereafter the glass plate was put into contact with the surface of the resin as shown in FIG. 5(c) such that the concave portions of the glass plate are opposed to the no-electrode surface of the circuit substrate. After heating the circuit substrate and the glass plate to 240° C. while keeping the glass plate in contact with the circuit substrate, this temperature was maintained for 30 seconds so as to boil "substance capable of generating gas" and thereby producing the gas bubbles therefrom.

As the generated bubbles continued moving within the resin, the solder powder was allowed to congregate onto the electrodes so as to eventually form the solder bumps. The state of the bubble generation was observed from above through the transparent glass plate. After the formation of the solder bumps was completed, the glass plate was removed from the surface of the resin. Thereafter, a washing treatment was performed with isopropyl alcohol to remove the resin component from the surface of the circuit substrate. As a result, the electronic component having the solder bumps as shown in FIG. 5(f) was obtained.

Comparative Example 1

In Comparative Example 1, an electronic component assembly was produced by the use of an electronic component having no concave portion formed in the surface thereof.

Specifically, the electronic component assembly as shown in FIG. 3(e) was produced in a similar way to Example 1, except that the electronic component with no concave portion formed in the surface thereof was used. In other words, the difference between Comparative Example 1 and Example 1 was that there was no concave portion for bubble generation in the circuit substrate and semiconductor TEG chip of Comparative Example 1.

Comparative Example 2

In Comparative Example 2, an electronic component having solder bumps was produced by the use of an electronic component with no concave portion formed in the surface thereof.

Specifically, the electronic component having solder bumps as shown in FIG. 4(f) was produced in a similar way to Example 3, except that the electronic component and the flat plate, both of which have no concave portion formed in the surface thereof, were used. In other words, the difference between Comparative Example 2 and Example 3 was that there was no concave portion for bubble generation in both of the circuit substrate and the flat plate of Comparative Example 2. In this Comparative Example 2, the state of the bubble generation was observed through the transparent glass plate during heating.

(Results)

The observation of the electronic component assemblies obtained in Examples 1 and 2 was made. Specifically, the observation of the solder connections of each assembly was made by means of X ray, and through the cross section of the solder connections. In so doing, it was confirmed that a plurality of solder connections had been formed uniformly. It was also confirmed that all the solder powder of the solder resin mixture had self-congregated, and thus there had been no residual solder powder left away from the electrodes. While on the other hand, as for the electronic component assembly produced in Comparative Example 1, it was confirmed that most of the solder powder had congregated onto most of electrodes, but some electrodes had not been covered by the solder powder since the congregation of the solder powder had not taken place so much. Moreover, in Comparative Example 1, there had been a small amount of the residual solder powder left away from the electrodes.

Height of the solder bumps was measured with respect to the electronic components having solder bumps obtained in Example 3, Example 4 and Comparative Example 2. In Example 3, mean height of the bumps was 40 μm±10 μm. In Example 4, mean height of the bumps was 50 μm±7 μm. In Comparative Example 2, mean height of the bumps was 30 μm±20 μm. Thus, it was verified that solder bumps were formed with less variability in height in Example 3 and Example 4 than that of Comparative Example 2.

When the state of the bubble generation was observed from above through the flat plate, the bubble generation was observed at the entire region where the solder resin mixture had been applied in Comparative Example 1. Particularly, significant bubble generation was observed around the electrodes. It seemed in Comparative Example 1 that the generated bubbles had resided around the electrodes in a longer period of time.

In contrast, it was confirmed in Example 1 and Example 2 that the bubble generation had originated mainly around the concave portions so that the resin and the solder powder had congregated efficiently into a region between the electrodes.

From the above results, it was concluded that the control of the bubble generation was possible by providing the concave portions serving as an origin of bubble generation at desired positions of the electronic component or flat plate. Accordingly, it was also concluded that such control of the bubble generation contributed to an efficient self-congregation of the solder powder, which led to an improved productivity and an improved quality of "electronic component assembly" and "electronic component having solder bumps".

The present invention provides processes for producing an electronic component assembly and an electronic component having solder bumps, which are high in productivity and reliability. Accordingly, the processes of the present invention can be applicable to not only a flip chip mounting of the next-generation LSI, but also a connecting of the substrates.

The invention claimed is:

1. An electronic component assembly comprising:
   a first electronic component including a plurality of first electrodes provided on a first surface of the first electronic component;
   a second electronic component including a plurality of second electrodes provided on a first surface of the second electronic component;
   a resin including a solder powder provided on the first surface of the electronic component between the first electronic component and the second electronic component;
   solder connections disposed between the first electrodes on the first surface of the first electronic component and the second electrodes on the first surface of the second electronic component to electrically interconnect the first electrodes on the first electronic component and the second electrodes on the second electronic component; and
   at least one recessed portion in the first surface of the first electronic component, the recessed portion being free of solder material, and the recessed portion being located in an area of the first surface of the first electronic component that is not occupied by the first electrodes and is adjacent to the first electrodes,
   wherein the at least one recessed portion is provided for bubble generation and has a tapered shape with a taper angle of less than 90 degrees.

2. The electronic component assembly according to claim 1, wherein the at least one recessed portion is constructed in the form of a groove.

3. The electronic component assembly according to claim 1, wherein the at least one recessed portion is formed in a central region of the first surface of the first electronic component between adjacent ones of the first electrodes.

4. The electronic component assembly according to claim 1, wherein the first surface of the second electronic component includes at least one recessed portion located in an area of the first surface of the second electronic component that is not occupied by the second electrodes.

5. The electronic component assembly according to claim 4, wherein the recessed portion in the first surface of the second electronic component is located in a central region between adjacent ones of the second electrodes.

6. The electronic component assembly according to claim 1, wherein the at least one recessed portion is constructed in the form of an elongated groove.

7. An electronic component assembly comprising:
- a first electronic component including a plurality of first electrodes provided on a first major surface of the first electronic component;
- a second electronic component including a plurality of second electrodes provided on a first major surface of the second electronic component;
- a resin including a solder powder provided between the first electronic component and the second electronic component;
- solder connections disposed between the first electrodes on the first major surface of the first electronic component and the second electrodes on the first major surface of the second electronic component to electrically interconnect the first electrodes on the first electronic component and the second electrodes on the second electronic component; and
- the first major surface of the first electronic component having an elongated groove positioned parallel to the first major surface of the first electronic component, wherein the elongated groove is provided for bubble generation and is free of solder material, and the elongated groove is located in an area of the first surface of the first electronic component that is not occupied by the first electrodes and is adjacent to the first electrodes.

* * * * *